(12) United States Patent
Samonji et al.

(10) Patent No.: US 6,909,733 B2
(45) Date of Patent: Jun. 21, 2005

(54) SEMICONDUCTOR LASER DEVICE

(75) Inventors: Katsuya Samonji, Takatsuki (JP); Toru Takayama, Nara (JP); Osamu Imafuji, Takatsuki (JP); Masaaki Yuri, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 281 days.

(21) Appl. No.: 09/968,942

(22) Filed: Oct. 3, 2001

(65) Prior Publication Data

US 2002/0044583 A1 Apr. 18, 2002

(30) Foreign Application Priority Data

Oct. 4, 2000 (JP) .......................................... 2000-304571
Apr. 26, 2001 (JP) .......................................... 2001-128899

(51) Int. Cl.[7] ................................................ H01S 5/00
(52) U.S. Cl. .......................................... 372/45; 372/46
(58) Field of Search .............................. 372/43–50, 96

(56) References Cited

U.S. PATENT DOCUMENTS

| | | | |
|---|---|---|---|
| 5,345,464 A | 9/1994 | Takemoto | 372/46 |
| 5,395,792 A | 3/1995 | Ikawa | 438/43 |
| 5,556,084 A | 9/1996 | Hodges | 269/60 |
| 5,727,012 A * | 3/1998 | Baillargeon et al. | 372/46 |
| 5,940,423 A | 8/1999 | Sahara | |
| 6,115,399 A | 9/2000 | Shakuda | 372/45 |

FOREIGN PATENT DOCUMENTS

| | | | | |
|---|---|---|---|---|
| CN | 1169608 A | | 1/1998 | |
| EP | 0 521 395 A1 | | 1/1993 | |
| EP | 0 554 089 A1 | | 8/1993 | |
| EP | 0 753 915 A2 | | 1/1997 | |
| EP | 0 794 601 A1 | | 9/1997 | |
| JP | 02-045991 | * | 2/1990 | 372/45 |
| JP | 05-218582 | | 8/1993 | |
| JP | 08-264888 | * | 11/1996 | H01S/3/18 |

* cited by examiner

Primary Examiner—Quyen Leung
(74) Attorney, Agent, or Firm—McDermott Will & Emery LLP

(57) ABSTRACT

A semiconductor laser device comprises, on top of an active layer, an n-type cladding layer of $Al_{x1}Ga_{1-x1}As$ and a p-type cladding layer of $(Al_xGa_{1-x})_yIn_{1-y}P$ for defining a barrier height. The p-type cladding layer for defining a barrier height contains more component elements than the n-type cladding layer. The potential difference between the conduction band edges of the p-type cladding layer for defining a barrier height and the active layer is greater than the potential difference between the conduction band edges of the n-type cladding layer and the active layer. The carriers in the active layer are prevented from overflowing into the p-type cladding layer and a material having a high thermal conductivity is used for the n-type cladding layer to prevent the phenomenon of thermal saturation, thereby providing improved optical output.

25 Claims, 11 Drawing Sheets

SEMICONDUCTOR LASER DEVICE

BACKGROUND OF THE INVENTION

The present invention relates to the structure of a semiconductor laser device which is suitable for use as a Fabry-Perot semiconductor laser device or a semiconductor laser device with the DBR structure. More particularly, the present invention relates to an improvement in optical output power of the semiconductor laser device.

Conventionally, writable and rewritable optical disk apparatuses have been required for writing at higher speeds and this in turn has demanded an even greater power output of an infrared semiconductor laser device. To provide a semiconductor laser device with a greater power output, it is necessary to reduce the risk of catastrophic optical damage (hereinafter referred to as the COD) to the edges of the laser device and improve the level of output saturation resulting from heat.

As a first prior-art example of the most typical semiconductor laser device, a semiconductor laser device is known which comprises the active layer of GaAs and two cladding layers of $Al_xGa_{1-x}As$ ($0 \leq x \leq 1$, hereinafter referred to as AlGaAs in some cases) for sandwiching the active layer therebetween vertically.

As a second prior-art example, also known is a semiconductor laser device comprising the active layer of GaAs, $Al_{x1}Ga_{1-x1}As$ ($0 \leq x1 \leq 1$, hereinafter referred to as AlGaAs in some cases), or $In_{x2}Ga_{1-x2}As$ ($0 \leq x2 \leq 1$, hereinafter referred to as InGaAs in some cases). The laser device also comprises two cladding layers of $(Al_{x3}Ga_{1-x3})_yIn_{1-y}P$ ($0 \leq x3 \leq 1$, $0 \leq y \leq 1$, hereinafter referred to as AlGaInP in some cases) which have a large bandgap and sandwich the active layer therebetween vertically. (For example, refer to Japanese Patent Laid-Open Publication No. Hei 5-218582.)

However, the aforementioned semiconductor laser devices have disadvantages that should be improved as described below.

For example, under conditions for generating laser of the semiconductor laser device at high output powers, a considerable increase in temperature in the active layer would cause an excessive density of carriers injected to the active layer, resulting in spillover (overflow) of carriers from the active layer to the cladding layers. The spillover of carriers from the active layer to the cladding layers causes the carriers to be dissipated for non-radiative recombination, thereby causing a further increase in temperature in the active layer. Consequently, under conditions for generating laser at high output powers, a phenomenon of thermal saturation occurs in which the carriers are dissipated due to an increase in temperature of the chip and this causes the optical output not to exceed a certain value with an increase in current. In particular, a semiconductor laser device having a single quantum well layer is susceptible to this phenomenon.

In addition, under conditions for generating laser of the semiconductor laser device at high output powers, a considerable increase in temperature in the active layer causes a considerable increase in temperature of the resonator cavity end faces. In some cases, this causes the so-called COD to occur in which light is increasingly absorbed at the resonator cavity end faces and this causes a local damage (melting) to the crystal structure when a certain amount of current is achieved.

The aforementioned phenomenon of thermal saturation or the COD has been an impediment to the improvement of efficiency of the semiconductor laser device.

On the other hand, suppose that a crystal containing no phosphor, for example, an AlGaAs layer is grown after the crystal growth of a compound semiconductor containing phosphor such as an AlGaInP layer. In this case, a gas containing phosphor is decomposed into phosphor, which would contaminate the AlGaAs layer. Accordingly, an AlGaAs layer employed for the active layer of a light-emitting element would cause the characteristics of the active layer to change due to the contamination of the AlGaAs layer with the phosphor. This would make it difficult to control the efficiency and the wavelength for generating laser of the semiconductor laser device, thereby raising the possibility of reducing the manufacturing yield of the semiconductor laser device.

SUMMARY OF THE INVENTION

It is therefore a first object of the present invention to improve the optical output of a semiconductor laser device by providing the device with means for preventing the phenomenon of thermal saturation or the COD occurring at a relatively small amount of current.

Furthermore, it is a second object of the present invention to provide a method for fabricating the semiconductor laser device with increased yields.

A first semiconductor laser device according to the present invention has an active layer which is provided on a substrate to act as a region for generating laser. The semiconductor laser device comprises an n-type cladding layer which is formed of a first semiconductor containing two or more component elements and overlies or underlies the active layer. The semiconductor laser device also comprises a p-type cladding layer for defining a barrier height. The p-type cladding layer is formed of a second semiconductor containing two or more component elements and is disposed opposite to the n-type cladding layer to sandwich the active layer between the n-type cladding layer and the p-type cladding layer. The second semiconductor contains more component elements than the first semiconductor.

This structure provides a wider range for the adjustment of composition of the second semiconductor. Thus, the potential difference between the conduction band edges of the p-type cladding layer for defining a barrier height and the active layer can be made larger to reduce the overflow of electrons into the p-type cladding layer for defining a barrier height, thereby improving the efficiency of confining electrons to the active layer. It is also facilitated to adjust the thermal conductivity of the n-type cladding layer so as to be larger than that of the p-type cladding layer for defining a barrier height, thereby providing an improved level of heat dissipation for the semiconductor laser device. Consequently, the semiconductor laser device can be provided with an improved optical output. The potential difference between the conduction band edges of the p-type cladding layer for defining a barrier height and the active layer is greater than the potential difference between the conduction band edges of the n-type cladding layer and the active layer. This ensures to provide an effect of preventing electrons from overflowing into the p-type cladding layer for defining a barrier height.

The active layer is formed of AlGaAs or GaAs and the second semiconductor forming the p-type cladding layer for defining a barrier height has a composition expressed by $(Al_xGa_{1-x})_yIn_{1-y}P$ ($0 \leq x \leq 1$, $0 \leq y \leq 1$). This makes it easier to make larger the potential difference between the conduction band edges of the p-type cladding layer for defining a barrier height and the active layer.

The p-type cladding layer for defining a barrier height has a thickness of 130 nm or more and 300 nm or less, thereby making it possible to provide a reduced thermal resistance for a heat conduction path leading from the active layer to the p-type cladding layer for defining a barrier height.

The second semiconductor has an Al composition ratio x within the range of $0.3 \leq x \leq 0.7$. This makes it possible to increase the potential difference to more than 350 meV between the conduction band edges of the p-type cladding layer for defining a barrier height and the active layer. It is also made possible to effectively prevent electrons from overflowing from the active layer.

The second semiconductor has an In composition ratio y within the range of $0.45 \leq y \leq 0.55$. This makes it possible to realize the lattice matching between the GaAs forming the active layer and the second semiconductor, thereby providing an improved crystallinity of the second semiconductor.

The first semiconductor forming the n-type cladding layer has a composition expressed by $Al_{x1}Ga_{1-x1}As$ ($0 \leq x1 \leq 1$). This ensures to make the thermal conductivity of the n-type cladding layer higher than that of the p-type cladding layer for defining a barrier height and improve the heat dissipation characteristic of the n-type cladding layer.

It is preferable that the first semiconductor has an Al composition ratio x1 within the range of $0.2 \leq x1 \leq 0.7$.

The active layer has a thickness of 0.5 nm or more and 5 nm or less, thereby making it possible to prevent heat absorption at the facets and provide improved optical output.

The semiconductor laser device further comprises a semiconductor layer of $Al_{x2}Ga_{1-x2}As$ ($0 \leq x2 \leq 1$) disposed opposite to the active layer to sandwich the p-type layer for defining a barrier height between the active layer and the semiconductor layer. This makes it possible to dissipate heat generated in the active layer more effectively.

The p-type cladding layer for defining a barrier height overlies the active layer and contains phosphor as a component element, and the active layer is formed of a semiconductor containing no phosphor. This structure allows the p-type cladding layer, containing phosphor, for defining a barrier height to be formed after the active layer has been formed, thereby making it possible to prevent the active layer from being contaminated with the phosphor. Accordingly, almost no change in characteristic of the active layer would be caused which would otherwise vary the efficiency and the wavelength for generating laser of the semiconductor laser device.

For the same reason, it is preferable that the n-type cladding layer underlies the active layer and is formed of a semiconductor containing no phosphor.

The present invention is also applicable to a semiconductor laser device having a Fabry-Perot (FP) resonator cavity as well as a distributed Bragg reflector (DBR) structure.

A second semiconductor laser device has an active layer which acts as a region for generating laser and provided on a substrate. The semiconductor laser device comprises an n-type cladding layer formed of a first semiconductor and overlying or underlying the active layer and a p-type cladding layer for defining a barrier height. The p-type cladding layer is formed of a second semiconductor and disposed opposite to the n-type cladding layer to sandwich the active layer between the n-type cladding layer and the p-type cladding layer. The semiconductor laser device also comprises at least one p-type cladding layer for relaxing a first spike. The p-type cladding layer is provided between the p-type cladding layer for defining a barrier height and the active layer. The magnitude of the potential difference between valence band edges of the p-type cladding layer for defining a barrier height and the active layer is greater than the magnitude of the potential difference between valence band edges of the cladding layer for relaxing the first spike and the active layer.

This structure makes it possible to reduce the barrier height or the band discontinuity caused by a spike formed in accordance with the potential difference between the valence band edges of the p-type cladding layer for defining a barrier height and the active layer. Accordingly, the operating voltage can be reduced.

The active layer is formed of AlGaAs or GaAs, and the second semiconductor forming the p-type cladding layer for defining a barrier height has a composition expressed by $(Al_{x1}Ga_{1-x1})_{y1}In_{1-y1}P$ ($0 \leq x1 \leq 1$, $0 \leq y1 \leq 1$). This makes it possible to improve the efficiency of confining electrons to the active layer and thereby provide improved optical output.

The p-type cladding layer for relaxing the first spike has a composition expressed by $Al_{x2}a_{1-x2}As$ ($0 \leq x2 \leq 1$), where x2 increases in the direction from the active layer to the p-type cladding layer for defining a barrier height. This makes it possible to eliminate almost all spikes which would be otherwise formed in the region from the p-type cladding layer for defining a barrier height to the active layer.

The p-type cladding layer for relaxing the first spike has a composition expressed by $(Al_{x3}Ga_{1-x3})_{y2}In_{1-y2}P$ ($0 \leq x3 \leq 1$, $0 \leq y2 \leq 1$), where x3 increases in the direction from the active layer to the p-type cladding layer for defining a barrier height. This also makes it possible to eliminate almost all spikes which would be otherwise formed in the region from the p-type cladding layer for defining a barrier height to the active layer.

The semiconductor laser device further comprises a p-type contact layer disposed opposite to the active layer to sandwich the p-type cladding layer for defining a barrier height between the active layer and the p-type contact layer. The semiconductor laser device also comprises at least one p-type cladding layer for relaxing a second spike. The p-type cladding layer is provided between the p-type cladding layer for defining a barrier height and the p-type contact layer. The magnitude of the potential difference between valence band edges of the p-type cladding layer for defining a barrier height and the p-type cladding layer for relaxing the second spike is less than the magnitude of the potential difference between valence band edges of the p-type cladding layer for defining a barrier height and the p-type contact layer. This structure makes it possible to reduce the barrier height or the band discontinuity caused by a spike formed in accordance with the potential difference between the valence band edges of the p-type cladding layer for defining a barrier height and the p-type contact layer. Accordingly, the operating voltage can be reduced.

The p-type cladding layer for relaxing the second spike has a composition expressed by $Al_{x4}Ga_{1-x4}As$ ($0 \leq x4 \leq 1$), where x4 decreases in the direction from the p-type cladding layer for defining a barrier height to the p-type contact layer. This makes it possible to eliminate almost all spikes which would be otherwise formed in the region from the p-type cladding layer for defining a barrier height to the p-type contact layer.

The p-type cladding layer for relaxing the second spike has a composition expressed by $(Al_{x5}Ga_{1-x5})_{y3}In_{1-y3}P$ ($0 \leq x5 \leq 1$, $0 \leq y3 \leq 1$), where x5 decreases in the direction from the p-type cladding layer for defining a barrier height to the p-type contact layer. This makes it possible to eliminate almost all spikes which would be otherwise formed in the region from the p-type cladding layer for defining a barrier height to the p-type contact layer.

The semiconductor laser device further comprises a current blocking layer having a window portion. The current blocking layer is disposed opposite to the active layer to sandwich the p-type cladding layer for defining a barrier height between the active layer and the current blocking layer. The semiconductor laser device also comprises a buried p-type cladding layer formed to fill in the window portion of the current blocking layer. The refractive index of the current blocking layer is preferably less than the refractive indices of the p-type cladding layer for defining a barrier height and the buried p-type cladding layer. This makes it possible to realize a waveguide structure with a real refractive index, thereby reducing optical waveguide losses.

It is preferable that the current blocking layer has a composition expressed by $Al_{x6}Ga_{1-x6}As$ ($0 \leq x6 \leq 1$), and an etch stop layer of $(Al_{x7}Ga_{1-x7})_{y4}In_{1-y4}P$ ($0 \leq x7 \leq 1$, $0 \leq y4 \leq 1$) is further provided between the p-type cladding layer for defining a barrier height and the buried cladding layer.

The semiconductor laser device further comprises a p-type contact layer disposed opposite to the active layer to sandwich the p-type cladding layer for defining a barrier height between the active layer and the p-type contact layer. The semiconductor laser device also comprises at least one p-type cladding layer for relaxing the second spike. The p-type cladding layer is provided between the buried p-type cladding layer and the p-type contact layer. The magnitude of the potential difference between valence band edges of the p-type cladding layer for relaxing the second spike and the p-type contact layer is less than the magnitude of the potential difference between valence band edges of the buried p-type cladding layer and the p-type contact layer. This makes it possible to provide a further reduced operating voltage.

The p-type cladding layer for relaxing the second spike has a composition expressed by $Al_{x8}Ga_{1-x8}As$ ($0 \leq x8 \leq 1$), where x8 decreases in the direction from the buried p-type cladding layer to the p-type contact layer. This makes it possible to eliminate almost all spikes which would be otherwise formed in the region from the buried p-type cladding layer to the p-type contact layer.

The second semiconductor laser device may comprise a Fabry-Perot (FP) resonator cavity or a distributed Bragg reflector (DBR) structure.

DETAILED DESCRIPTION OF THE INVENTION

First Embodiment

-The Structure of a Semiconductor Laser Device and its Fabrication Method-

Figure 1:
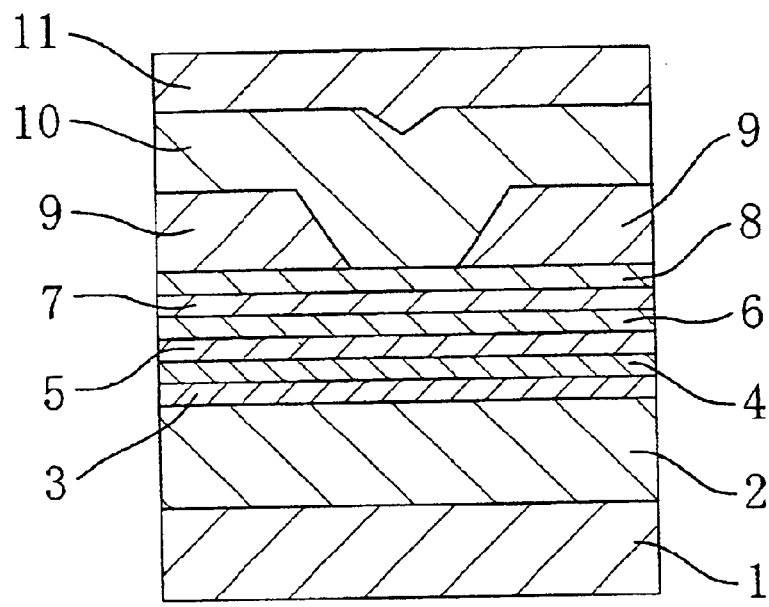
FIG. 1 is a cross-sectional view illustrating a semiconductor laser device, in a direction orthogonal to that of the stripe, according to a first embodiment of the present invention.

FIG. 1 is a cross-sectional view illustrating a semiconductor laser device, in a direction orthogonal to that of the stripe, according to a first embodiment of the present invention. This embodiment is described with reference to a semiconductor laser device having a Fabry-Perot (FP) resonator cavity.

As shown in FIG. 1, the semiconductor laser device according to this embodiment has the following layers which are sequentially formed on an n-type GaAs substrate 1. The layers include an n-type cladding layer 2 of n-type $Al_{0.5}Ga_{0.5}As$ 3 μm in thickness, an optical guiding layer 3 of $Al_{0.3}Ga_{0.7}As$ 40 nm in thickness, a single quantum well active layer 4 of GaAs 3 nm in thickness, an optical guiding layer 5 of $Al_{0.3}Ga_{0.7}As$ 40 nm in thickness, a first p-type cladding layer 6 of p-type $(Al_{0.3}Ga_{0.7})_{0.5}In_{0.5}P$ 50 nm in thickness for defining a barrier height, a second p-type cladding layer 7 of p-type $Al_{0.5}Ga_{0.5}As$ 100 nm in thickness, an etch stop layer (hereinafter referred to as the ES layer) 8 of p-type $Al_{0.2}Ga_{0.8}As$ 10 nm in thickness, a current blocking layer 9 of n-type $Al_{0.6}Ga_{0.4}As$ 700 nm in thickness, a third p-type cladding layer 10 of p-type $Al_{0.5}Ga_{0.5}As$ 2.5 μm in thickness, and a contact layer 11 of p-type GaAs 2.5 μm in thickness. Although not shown, an n-type electrode is provided on the reverse side of the n-type GaAs substrate 1 and a p-type electrode on the contact layer 11, respectively.

Of the members forming the aforementioned semiconductor laser device, the compound semiconductor layers were grown by the MOVPE method using the metal organic vapor phase epitaxial (hereinafter referred to as the MOVPE) equipment in accordance with the following procedure.

First, the cladding layer 2, the optical guiding layer 3, the active layer 4, the optical guiding layer 5, and the first p-type cladding layer 6 were epitaxially grown in sequence on the n-type GaAs substrate 1. Thereafter, the second p-type cladding layer 7, the ES layer 8, and the current blocking layer 9 were epitaxially grown in sequence on the first p-type cladding layer 6. An n-type GaAs substrate 1 having any crystal film formed thereon is hereinafter referred to simply as an epitaxial substrate.

Subsequently, the epitaxial substrate was taken out of the MOVPE equipment to selectively etch the current blocking layer 9, thereby forming a groove that reaches the ES layer 8.

Then, the epitaxial substrate was placed back into the MOVPE equipment, where the third p-type cladding layer 10 for filling the groove provided in the current blocking layer 9 was epitaxially grown on the ES layer 8 and the current blocking layer 9. Thereafter, the contact layer 11 was epitaxially grown on the third p-type cladding layer 10.

Thereafter, the epitaxial substrate was taken out of the MOVPE equipment to provide the n-type electrode and the p-type electrode on the reverse side of the n-type GaAs substrate 1 and the contact layer 11, respectively.

Then, the epitaxial substrate was cleaved into a plurality of laser chips with a resonator cavity 800 μm in length. Thereafter, the two mutually opposite cleaved facets of a laser chip or so-called edges were coated with a multi-layered film of amorphous silicon and $SiO_2$ as an end face protective coating. In addition, to obtain high optical power output, the edges were coated asymmetrically such that the rear facet of the laser chip had a high reflectivity (90%) and the front facet of the laser chip had a low reflectivity (10%).

According to the semiconductor light-emitting device (the semiconductor laser device) of this embodiment, of the two cladding layers for vertically sandwiching the active layer 4 therebetween, the first p-type cladding layer 6 for defining a barrier height is formed of AlGaInP. This makes it possible to provide a large potential difference ΔEc between the conduction bands of the active layer 4 and the first p-type cladding layer 6. Consequently, it is made possible to prevent the overflow of the electrons (carriers) of the active layer 4 into the first p-type cladding layer 6. This in turn prevents the phenomenon of thermal saturation, caused by the overflow of the carriers, from occurring under conditions for generating laser at high power output.

In addition, the n-type cladding layer 2 is formed of AlGaAs having a relatively high thermal conductivity. Thus, the active layer will have a slight increase in temperature even under conditions for generating laser of the semiconductor laser device at high power output. This prevents the increase in temperature of the resonator cavity end faces, whereby the amount of light to be absorbed at the resonator cavity end faces is reduced. Consequently, the catastrophic optical damage or the so-called COD is prevented.

Furthermore, according to the fabrication method of this embodiment, the active layer 4 of GaAs is grown and then p-type $(Al_{0.7}Ga_{0.3})_{0.5}In_{0.5}P$ is epitaxially grown on the active layer 4 using phosphine. Therefore, it can be said that almost no phosphor, into which the phosphine is decomposed, contaminates the active layer 4. Accordingly, almost no change in characteristic of the active layer 4 would be caused which would otherwise vary the efficiency and the wavelength for generating laser of the semiconductor laser device, thereby degrading the characteristics thereof. Consequently, even in the case where the semiconductor laser devices are mass produced, it is possible to provide a reduced variation in optical characteristic and an improved manufacturing yield for the semiconductor laser device.

-Comparison With a First Prior-art Example-

To confirm the effect of the semiconductor light-emitting device according to this embodiment, the following discussions and considerations were made on the semiconductor laser device of the present invention as described below.

Figure 2:
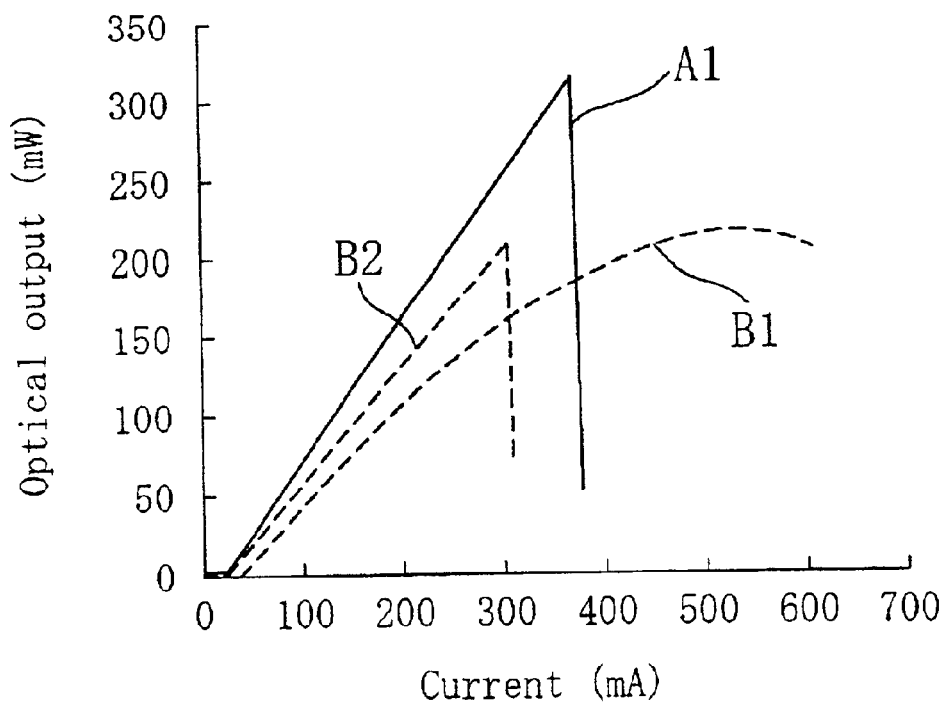
FIG. 2 is a view illustrating the I-L characteristic of the semiconductor laser device according to the first embodiment in comparison with that of first prior-art semiconductor laser devices.

FIG. 2 is a view illustrating the current against optical output characteristic (hereinafter referred to as the I-L characteristic) of the semiconductor laser device according to this embodiment in comparison with that of first prior-art semiconductor laser devices. Referring to FIG. 2, solid line A1 represents the I-L characteristic of the semiconductor laser device according to this embodiment. Broken line B1 represents the I-L characteristic of the first prior-art semiconductor laser device having a single quantum well active layer 3 nm in thickness, while broken line B2 represents the I-L characteristic of the first prior-art semiconductor laser device having a double quantum well active layer formed of two quantum wells each 3 nm in thickness. The semiconductor laser device according to this embodiment shown in FIG. 2 comprises a cladding layer (the n-type cladding layer 2) of n-type $Al_{0.5}Ga_{0.5}As$ underlying the active layer and a cladding layer (the first p-type cladding layer 6) of p-type $(Al_{0.7}Ga_{0.3})_{0.5}In_{0.5}P$ overlying the active layer. In contrast, each of the prior-art semiconductor laser devices shown in FIG. 2 comprises a cladding layer of n-type $Al_{0.5}Ga_{0.5}As$ underlying the active layer and a cladding layer of p-type $Al_{0.5}Ga_{0.5}As$ overlying the active layer.

As can be seen from FIG. 2, of the first prior-art semiconductor laser devices, the one having a single quantum well (see the broken line B1) will have no COD. However, there is raised a thermal saturation phenomenon in which the optical output does not exceed 220 mW at more than about 500 mA of current but is decreased contrary to expectations. On the other hand, the one having a double quantum well (see the broken line B2) has COD at around 300 mA of current and 200 mW of optical output before the phenomenon of thermal saturation occurs. In other words, with the prior-art semiconductor laser device having the cladding layers of AlGaAs overlying and underlying the active layer, it was difficult to realize stable operations for generating laser at more than 200 mW of optical output.

In contrast to this, the semiconductor laser device according to the present invention would have no saturation of optical output until the COD occurred at about 380 mA of current and 340 mW of optical output. Because of the following reasons, this is conceivably due to the structure of the first p-type cladding layer 6, or the cladding layer overlying the active layer 4, which is formed of $(Al_{0.7}Ga_{0.3})_{0.5}In_{0.5}P$.

Figure 3:
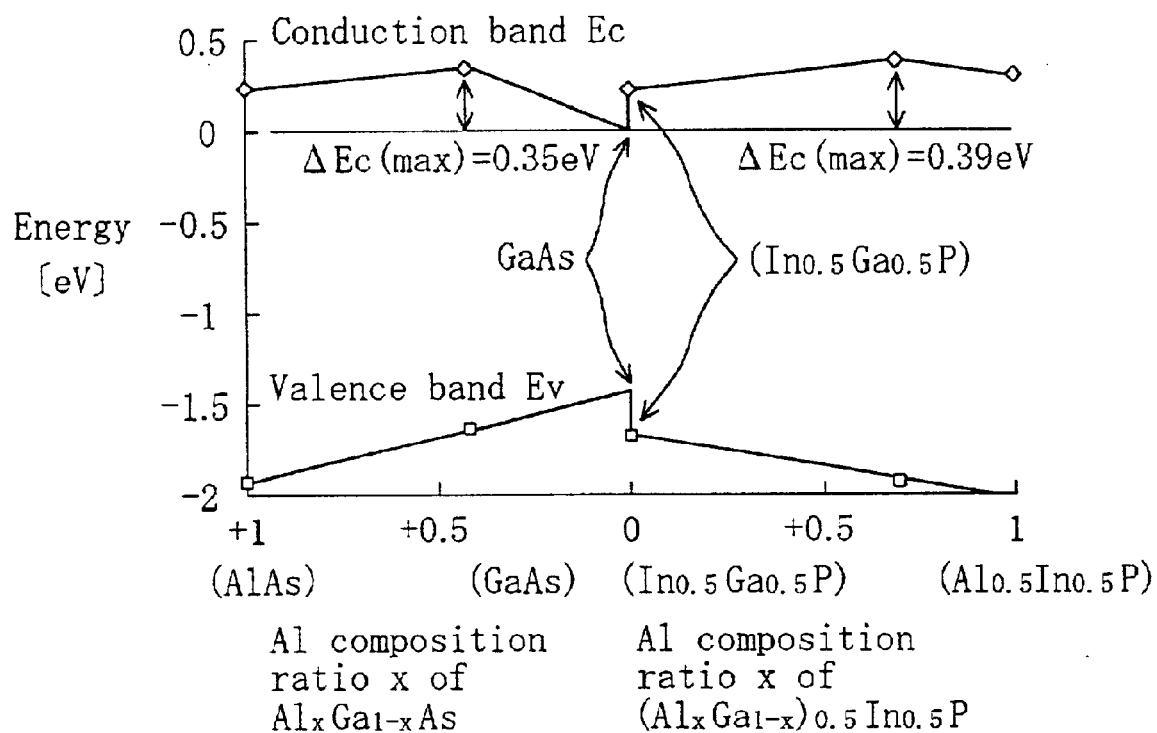
FIG. 3 is a view illustrating the difference in band structure between AlGaAs, GaAs, and AlGaInP layers, with the composition of the AlGaAs and AlGaInP layers being varied.

FIG. 3 is a view illustrating the difference in band structure between AlGaAs, GaAs, and AlGaInP layers, with the composition of the AlGaAs and AlGaInP layers being varied. The figure shows the band structure of a GaAs layer at the center, the band structure of an $Al_xGa_{1-x}As$ layer on the left with the Al composition ratio x being varied from zero (the right end) to one (the left end), and the band structure of an $(Al_xGa_{1-x})_{0.5}In_{0.5}P$ layer on the right with the Al composition ratio x being varied from zero (the left end) to one (the right end). Incidentally, a semiconductor laser device has an electron distribution extending to a region of high potential in the conduction band, whereas the hole distribution is restricted within a low potential region in the valence band. Therefore, the potential difference between valence band edges has less effect on the laser characteristics than the potential difference between conduction band edges. In this context, only the potential at the conduction band edge of each layer will be described in the following discussions.

As shown in FIG. 3, when the Al composition ratio x of the $Al_xGa_{1-x}As$ layer is varied from one to zero, the conduction band edge is provided with the highest potential at around 0.4 of the Al composition ratio x. At this time, the potential difference $\ddot{A}Ecmax$ between the conduction band edges of the $Al_xGa_{1-x}As$ layer and the GaAs layer is about 0.34 eV (340 mev). A prior-art semiconductor laser device has a potential difference of about 340 meV between one of the two cladding layers (having a composition of $Al_{0.5}Ga_{0.5}As$) and the GaAs layer. In contrast to this, when the Al composition ratio x is varied from zero to one in the $(Al_xGa_{1-x})_{0.5}In_{0.5}P$ layer, the potential at the conduction band edge is the highest at around 0.7 of the Al composition ratio x. At this time, the potential difference $\ddot{A}Ecmax$ from the conduction band edge of the GaAs layer is about 0.39 eV (390 meV). Therefore, the potential difference between the conduction band edges of the first p-type cladding layer 6 (having a composition of $(Al_{0.7}Ga_{0.3})_{0.5}In_{0.5}P$) and the active layer 4 of GaAs is abut 390 meV.

Figure 5:
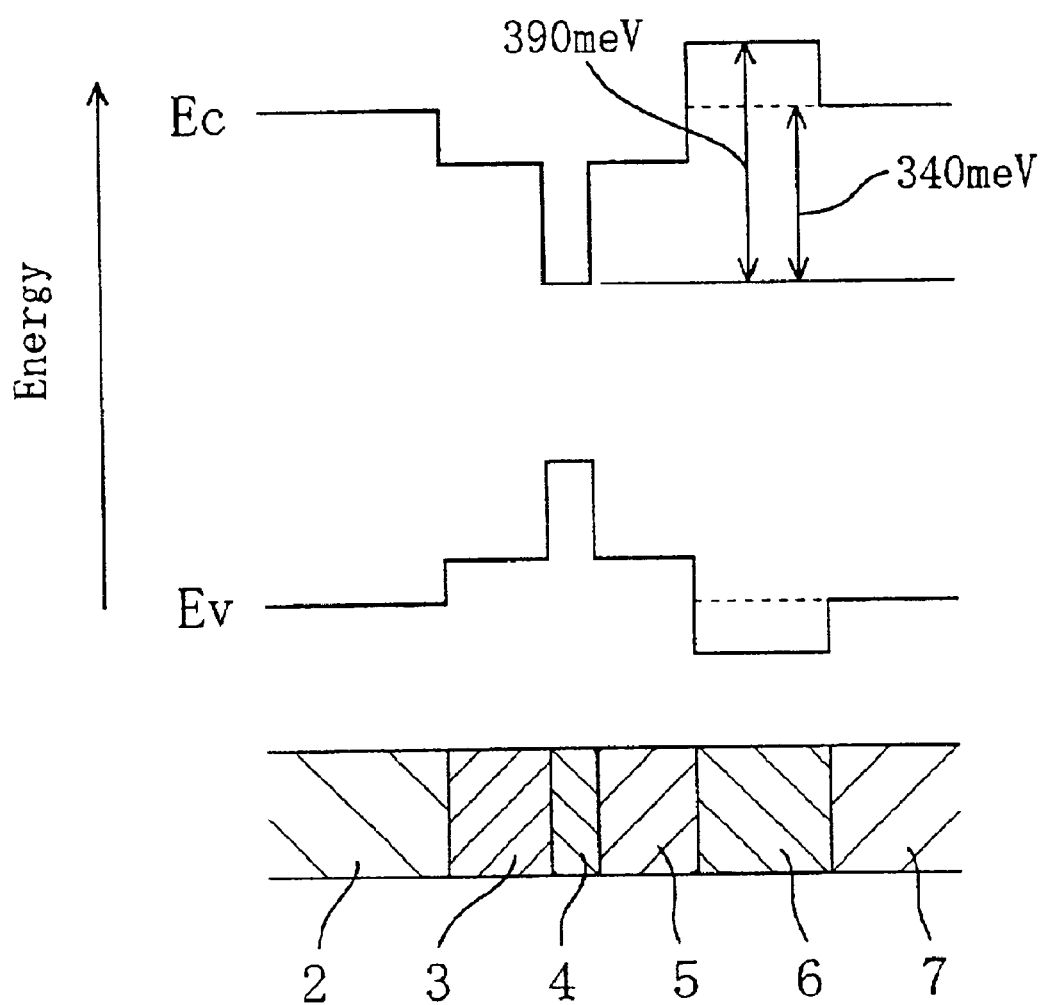
FIG. 5 is a schematic view illustrating the band state of a semiconductor laser device according to the first embodiment, with a voltage being applied thereto.

FIG. 5 is a schematic view illustrating the band state of the semiconductor laser device according to this embodiment, with a voltage being applied thereto. As shown in the figure, in the semiconductor laser device according to this embodiment, the potential difference between the conduction band edges of the n-type cladding layer 2 and the active layer 4 is about 340 meV, while the potential difference between the conduction band edges of the first p-type cladding layer 6 and the active layer 4 is about 390 meV.

Consequently, the electrons injected from the GaAs substrate 1 to the active layer 4 via the n-type cladding layer 2 is to be confined to the active layer 4 or the quantum well by a barrier of height about 390 meV. On the other hand, at the conduction band edge of the p-type cladding layer overlying the active layer of the prior-art semiconductor laser device indicated by the broken line in FIG. 5, there is a potential difference of only about 340 meV from the conduction band edge of the GaAs layer.

Summarizing the facts obtained from the aforementioned experimental data shows the following results for the semiconductor laser device according to this embodiment. That is, the potential difference $\ddot{A}Ecmax$ between the conduction band edges of the first p-type cladding layer 6 of $(Al_{0.7}Ga_{0.3})_{0.5}In_{0.5}P$ and the active layer 4 of GaAs is 390 meV, which is greater than a potential difference of 340 meV between the conduction band edges of the prior-art p-type cladding layer and the active layer. It is conceivable that this improves the efficiency of confining electrons to the active layer and therefore prevents carriers from overflowing from the conduction band edge, thereby providing high optical output.

In particular, by constructing the active layer 4 in a single quantum well 3 nm in thickness like the semiconductor laser device according to this embodiment, it is possible to reduce the amount of light to be absorbed at the edges in comparison with the device having a double quantum well structure. Consequently, this embodiment makes it possible to prevent the generation of heat at the edges of the resonator cavity, thereby providing as high a COD level as 340 mW.

-Comparison With the Second Prior-Art Example-

Figure 4:
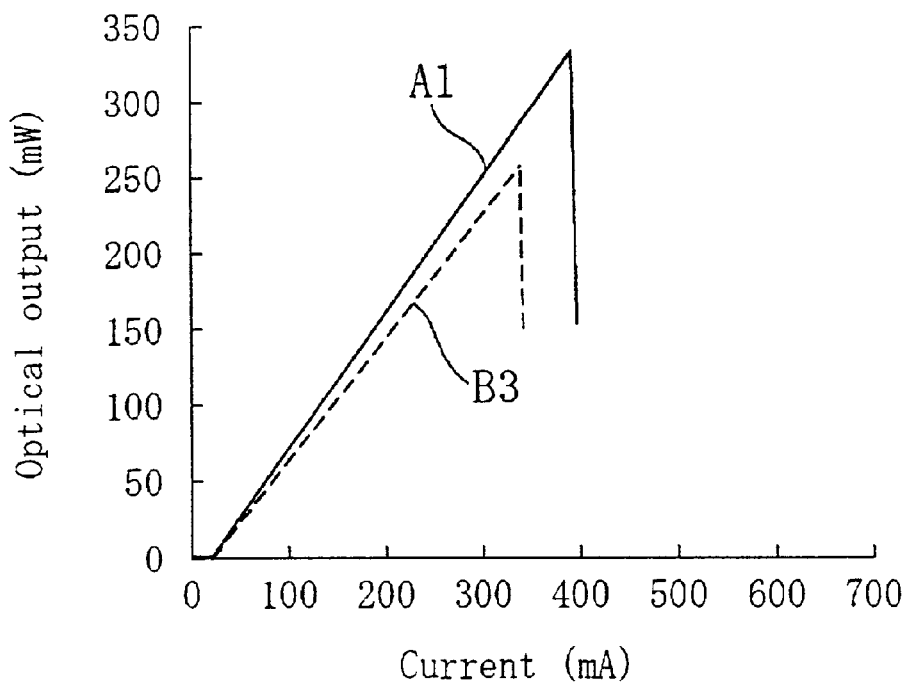
FIG. 4 is a view illustrating the I-L characteristic of the semiconductor laser device according to the first embodiment in comparison with that of a second prior-art semiconductor laser device.

FIG. 4 is a view illustrating the I-L characteristic of the semiconductor laser device according to this embodiment in comparison with that of the second prior-art semiconductor laser device. Referring to FIG. 4, the solid line A1 represents the I-L characteristic of the semiconductor laser device according to this embodiment like that shown in FIG. 2, while the broken line B3 represents the I-L characteristic of the semiconductor laser device having a single quantum well active layer 3 nm in thickness according to the second prior-art example. The semiconductor laser device according to the second prior-art example shown in FIG. 4 comprises a cladding layer of n-type $(Al_{0.7}Ga_{0.3})_{0.5}In_{0.5}P$ underlying the active layer and a cladding layer of p-type $(Al_{0.7}Ga_{0.3})_{0.5}In_{0.5}P$ overlying the active layer. That is, the semiconductor laser device according to the second prior-art example has the cladding layers of AlGaInP overlying and underlying the active layer.

As can be seen from FIG. 4, the semiconductor laser device according to the second prior-art example has COD occurring at around 340 mA of current and 260 mW of optical output. That is, for the semiconductor laser device according to the second prior-art example having cladding layers of AlGaInP overlying and underlying the active layer, it is difficult to realize stable operations for generating laser at 300 mW or more of optical output.

In contrast to this, the semiconductor laser device according to this embodiment has no saturation of optical output until the COD occurs at around 400 mA of current and 340 mW of optical output. In addition, the slope efficiency (the slope of the characteristic line A1) of the semiconductor laser device according to this embodiment is greater than that (the slope of the characteristic line B3) of the second prior-art example.

This is conceivably due to the structure in which the cladding layer overlying the active layer 4 or the first p-type cladding layer 6 is formed of $(Al_{0.7}Ga_{0.3})_{0.5}In_{0.5}P$, while the cladding layer underlying the active layer 4 or the n-type cladding layer 2 is formed of AlGaAs.

The second prior-art example has two cladding layers of AlGaInP which overlie and underlie the active layer and are larger in bandgap than the AlGaAs. It is thereby made possible to provide an increased potential difference between the conduction band edges of the active layer of GaAs and the cladding layer in comparison with that of the first prior-art example and thus realize a greater optical output than that provided by the first prior-art example.

However, AlGaInP is typically lower than AlGaAs in thermal conductivity. Table 1 below shows the thermal conductivity of $(Al_{0.7}Ga_{0.3})_{0.5}In_{0.5}P$ and $Al_{0.5}a_{0.5}s$.

TABLE 1

| Material | Thermal conductivity (W · cm$^{-1}$ · K$^{-1}$) |
| --- | --- |
| $(Al_{0.7}Ga_{0.3})_{0.5}In_{0.5}P$ | 0.067 |
| $Al_{0.5}a_{0.5}s$ | 0.111 |

As shown in Table 1 above, it is found that the thermal conductivity of $(Al_{0.7}Ga_{0.3})_{0.5}In_{0.5}P$ is about two times higher than that of the $Al_{0.5}a_{0.5}s$.

For this reason, the COD possibly occurs in the second prior-art example because the heat generated in the active layer is dissipated poorly and this causes the temperature at the resonator cavity end faces to be increased more easily than in the first prior-art example.

In contrast to this, the semiconductor laser device according to this embodiment is probably provided with better heat dissipation than the second prior-art example. This is because only one of the two cladding layers sandwiching the active layer (i.e., the first p-type cladding layer 6) therebetween is formed of $(Al_{0.7}Ga_{0.3})_{0.5}In_{0.5}P$ having a low thermal conductivity, while the other cladding layer (i.e., the n-type cladding layer 2) is formed of $Al_{0.5}Ga_{0.5}As$ having a relatively high thermal conductivity. Consequently, the semiconductor laser device according to this embodiment is conceivably provided with greater optical output than that provided by the second prior-art example.

Furthermore, as shown in FIG. 5, only the p-type cladding layer for defining a barrier height is formed of $(Al_{0.7}Ga_{0.3})_{0.5}In_{0.5}P$ having a large ÄEc. This allows the electrons injected from the GaAs substrate 1 to the active layer 4 via the n-type cladding layer 2 to be confined to the active layer 4 or a quantum well by means of a barrier of height about 390 mev. It is therefore conceivable that the function of confining electrons to the active layer of the semiconductor laser device according to this embodiment is generally never inferior to that of the second prior-art example.

Incidentally, suppose that $(Al_xGa_{1-x})_yIn_{1-y}P$ ($0 \le x \le 1$, $0 \le y \le 1$) is employed for the first p-type cladding layer 6. In this case, since y is about 0.5 and, among other things, $0.45 \le y \le 0.55$, the lattice constants of the first p-type cladding layer 6 and the underlying optical guiding layer 5 of $Al_{0.3}Ga_{0.7}As$ are generally matched with each other, thus allowing both layers to be in a lattice matched condition.

For y being about 0.5, it is preferable that $0.3 < x \le 0.7$. The first reason for this is that 350 meV$<\Delta Ec$ for $0.3 < x$ and thus electrons are more unlikely to overflow than in the semiconductor laser device according to the first prior-art example. In addition, the second reason is that the Al $(Al_{1-x}Ga_x)_yIn_{1-y}P$ is of a direct transition semiconductor type for $x \le 0.7$, while the $Al(Al_{1-x}Ga_x)_yIn_{1-y}P$ is of an indirect transition semiconductor type for $x > 0.7$. Accordingly, the bottom of the conduction band is shifted form point Γ to point X to reduce the $\Delta Ec$, thereby reducing the effect of preventing the electrons injected into the active layer from overflowing therefrom. Furthermore, under the condition that the $Al(Al_{1-x}Ga_x)_yIn_{1-y}P$ is of the direct transition semiconductor type ($x \le 0.7$), since $\Delta Ec$ increases as the Al composition ratio increases, it is particularly preferable that x=0.7.

Furthermore, this embodiment has employed the first p-type cladding layer 6 as thin as 50 nm in thickness to provide for a low thermal resistance between the active layer 4 and the p-type electrode. On the other hand, as shown in Table 1, the thermal conductivity of the AlGaInP is lower than that of the AlGaAs. It is thus preferable that the first p-type cladding layer 6 has a thicknesses equal to or greater than the de Broglie wavelength of an electron (about 10 nm), at which use can be made of the function of confining carriers thereto, and equal to 300 nm or less at which the heat dissipation is not adversely affected.

Incidentally, the thickness of the active layer 4 is preferably as thin as possible to provide as low an optical confinement coefficient as possible and thereby prevent as much optical absorption at the edges as possible. It is also preferable that the active layer has a single quantum well structure. It is further preferable that the single quantum well has a thickness of 0.5 nm or greater and 5 nm or less. This structure can provide a further improved COD level for the semiconductor laser device. Incidentally, it is preferable to employ a semiconductor material having a high thermal conductivity with almost no absorption of a laser beam and particularly preferable to employ AlGaAs.

Incidentally, not only AlGaAs or AlGaInP but also other semiconductor materials such as quarternary or higher-order mixed crystals, for example, $In_xGa_{1-x}As_yP_{1-y}$ ($0 \le x \le 1$, $0 \le y \le 1$, InGaAsP) or $B_xAl_yGa_{1-x-y-z}In_zN$ ($0 \le x \le 1$, $0 \le y \le 1$, $0 \le z \le 1$, BAlGaInN) are lower in thermal conductivity than ternary mixed crystals. In general, mixed crystals having a larger number of elements provide a lower thermal conductivity. In this context, the same effect as that obtained in the aforementioned embodiment can also be provided by employing an n-order mixed crystal (where n is an integer equal to or greater than three) as one of the two cladding layers sandwiching the active layer therebetween and a (n-1)-order mixed crystal as the other cladding layer. For this structure, materials other than AlGaAs may also be used as the active layer.

Incidentally, for quarternary or higher-order mixed crystals, it is possible to control the lattice constant and the energy bandgap independently. This makes it possible to obtain the desired bandgap while preventing defect formation in the crystal resulting from lattice mismatching. It is therefore preferable to employ a quarternary or higher order mixed crystal as one of the cladding layers. It is also possible to employ a ternary mixed crystal as a cladding layer so long as the crystal has a thickness equal to or less than the critical thickness at which dislocation occurs. Incidentally, the third p-type cladding layer 10 may be shaped in a ridge.

Second Embodiment

Figure 6:
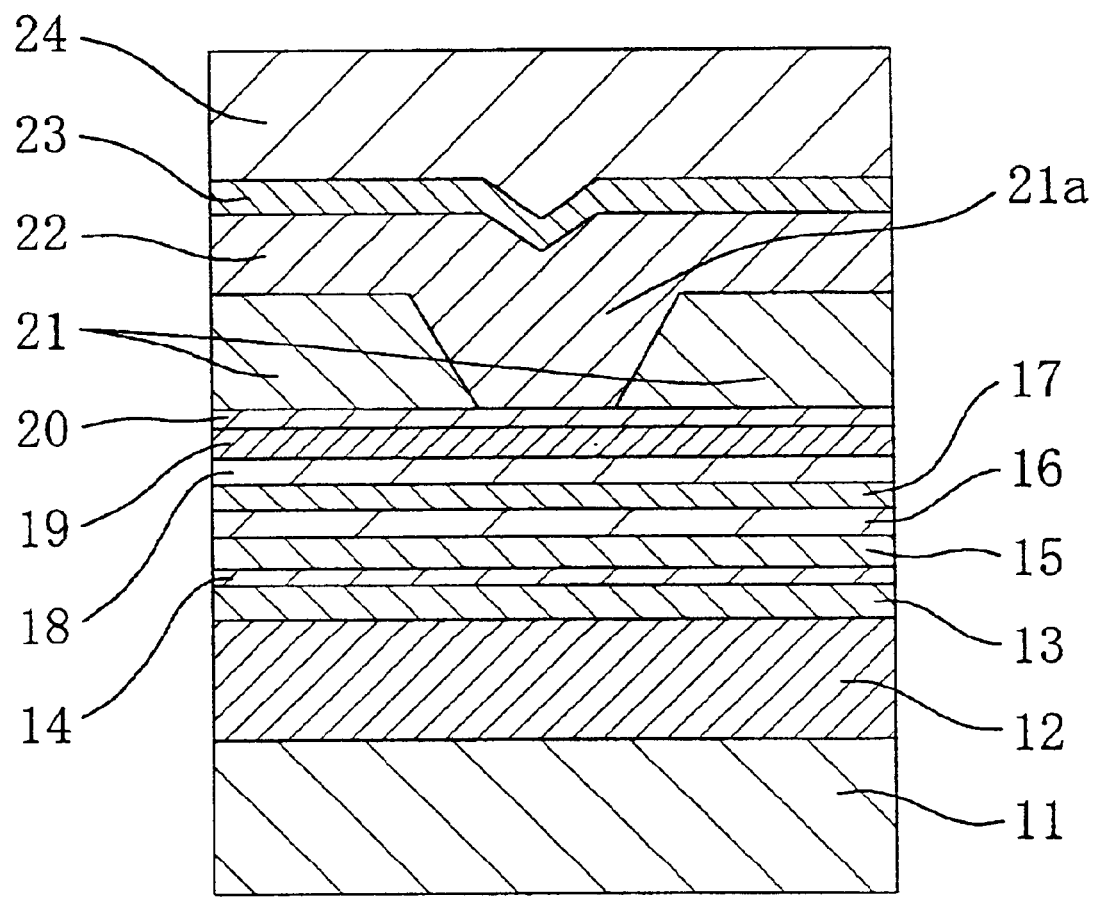
FIG. 6 is a cross-sectional view illustrating a semiconductor laser device, in a direction orthogonal to that of the stripe, according to a second embodiment of the present invention.

FIG. 6 is a cross-sectional view illustrating a semiconductor laser device, in a direction orthogonal to that of the stripe, according to a second embodiment of the present invention.

As shown in FIG. 6, the semiconductor laser device according to this embodiment has the following layers which are sequentially formed on an n-type GaAs substrate 11. The layers include an n-type cladding layer 12 of n-type $Al_{0.5}Ga_{0.5}As$ 3 μm in thickness, an optical guiding layer 13 of $Al_{0.3}Ga_{0.7}As$ 50 nm in thickness, a single quantum well active layer 14 of GaAs 3 nm in thickness, an optical guiding layer 15 of $Al_{0.3}Ga_{0.7}As$ 50 nm in thickness, a first cladding layer 16 of p-type $Al_{0.65}Ga_{0.35}As$ 25 nm in thickness for relaxing a first spike, a second p-type cladding layer 17 of p-type $(Al_{0.7}Ga_{0.3})_{0.5}In_{0.5}P$ 40 nm in thickness for defining a barrier height, a third p-type cladding layer 18 of p-type $Al_{00.75}Ga_{0.25}As$ 40 nm in thickness, a fourth p-type cladding layer 19 of p-type $Al_{0.5}Ga_{0.5}As$ 40 nm in thickness, an etch stop layer 20 of p-type $Al_{0.2}Ga_{0.8}As$ 10 nm in thickness, a current blocking layer 21 of n-type $Al_{0.7}Ga_{0.3}As$ 700 nm in thickness having a stripe-shaped window portion 21a, a fifth p-type cladding layer 22 of p-type $Al_{0.5}Ga_{0.5}As$ having a maximum thickness of 2.5 μm for filling in the window portion 21a of the current blocking layer 21 and extending over the current blocking layer 21, a sixth p-type cladding layer 23 of p-type $Al_{0.25}Ga_{0.75}As$ 40 nm in thickness, and a p-type contact layer 24 of p-type GaAs 2.5 μm in thickness. Although not shown, an n-type electrode is provided on the reverse side of the n-type GaAs substrate 11 and a p-electrode on the p-type contact layer 24, respectively.

Figure 7:
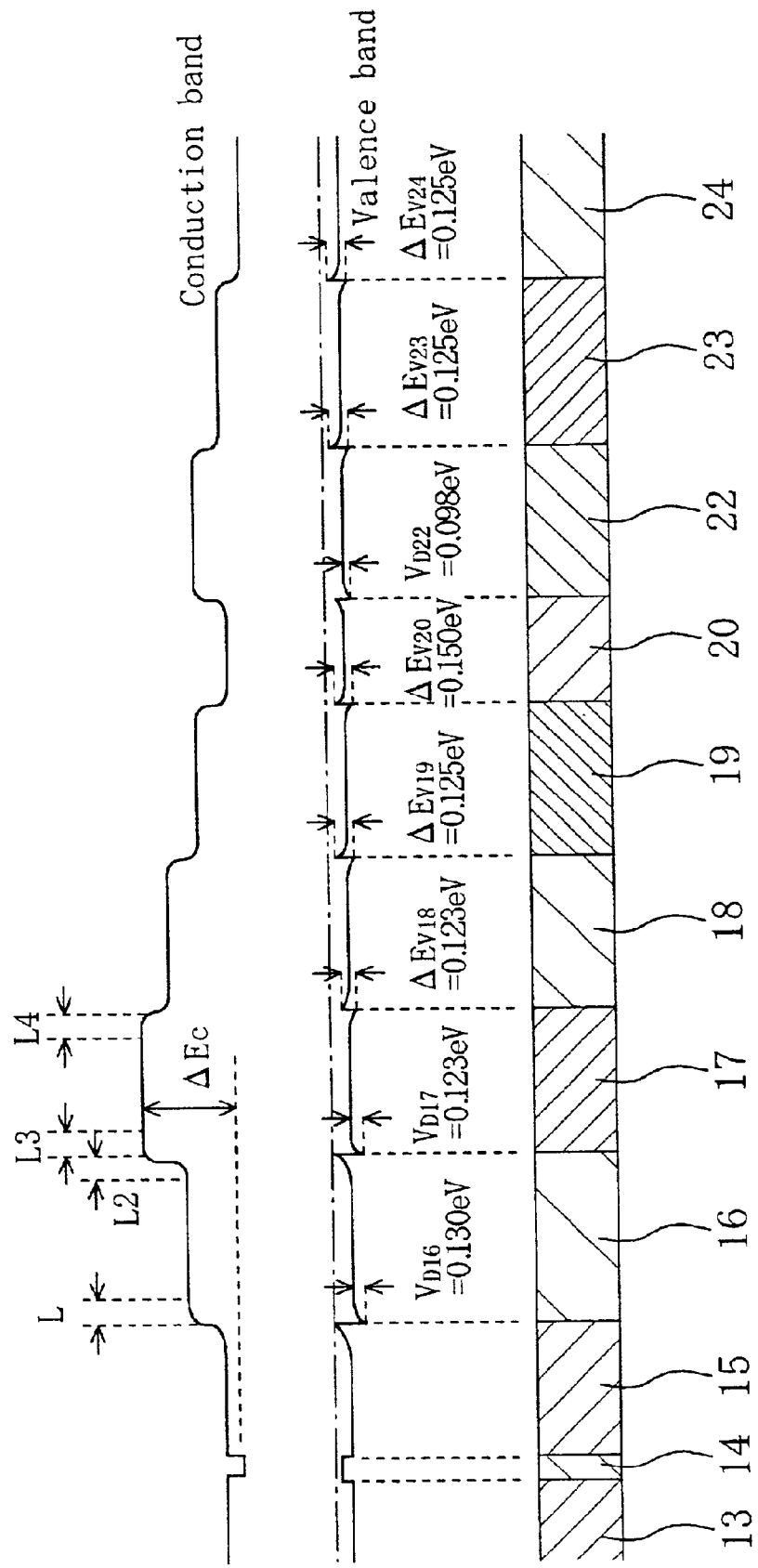
FIG. 7 is an energy band diagram of the conduction and valence bands from the optical guiding layer to the p-type contact layer in the semiconductor laser device according to the second embodiment.

FIG. 7 is an energy band diagram of the conduction and valence bands from the optical guiding layer 13 to the p-type contact layer 24 in the semiconductor laser device according to this embodiment. Incidentally, in FIG. 7, only for ease of understanding the band structure, each of the layers except for the active layer is expressed to be generally uniform in thickness. As shown in the figure, between the optical guiding layer 15 and the second p-type cladding layer 17 of p-type $(Al_{0.7}Ga_{0.3})_{0.5}In_{0.5}P$, provided is the first cladding layer 16 of p-type $Al_{0.65}Ga_{0.35}As$ having a bandgap greater than that of the optical guiding layer 15 and less than that of the second p-type cladding layer 17. In this structure, the optical guiding layer 15 has a density of $1 \times 10^{16}$ cm$^{-3}$ of p-type carriers, the first p-type cladding layer 16 has a carrier density of $7 \times 10^{17}$ cm$^{-3}$, and the second p-type cladding layer 17 has a carrier density of $7 \times 10^{17}$ cm$^{-3}$.

As shown in FIG. 7, spikes (parasitic barriers) formed at the interface between the optical guiding layer 15 and the first p-type cladding layer 16 and between the first p-type cladding layer 16 and the second p-type cladding layer 17 have a barrier height of $V_{D16}$ and $V_{D17}$, respectively. That is, although not shown in FIG. 5, a large spike is also formed at the valence band edge between the optical guiding layer 5 and the first p-type cladding layer 6 in the first embodiment. This embodiment has relaxed the large spike at the valence band edge by two smaller spikes.

Of the members forming the aforementioned semiconductor laser device, the compound semiconductor layers are grown using the metal organic vapor phase epitaxial (hereinafter referred to as the MOVPE) equipment in the same way in principle as in the first embodiment.

On the other hand, the epitaxial substrate is cleaved into laser chips having a length of 800 μm in the direction of the resonator cavity or the stripe. The two mutually opposite cleaved facets of a laser chip or so-called end faces are coated with a multi-layered film of amorphous silicon and $SiO_2$ as an edge protective coating. In addition, to obtain high optical power output, the end faces are coated asymmetrically such that the rear facet of the laser chip has a high reflectivity (90%) and the front facet of the laser chip has a low reflectivity (10%).

According to a semiconductor laser device of this embodiment, the second p-type cladding layer 17 is formed of p-type $(Al_{0.7}Ga_{0.3})_{0.5}In_{0.5}P$. As described in the first embodiment, this makes it possible to provide a large potential difference ΔEc between the conduction bands of the active layer 14 and the second p-type cladding layer 17. Thus, like in the first embodiment, the semiconductor laser device according to this embodiment makes it possible to improve the efficiency of confining electrons to the active layer 14 and thereby provide increased optical output.

In addition to this, in this embodiment, interposed between the optical guiding layer 15 and the second p-type cladding layer 17 is the first p-type cladding layer 16 of p-type $Al_{0.65}Ga_{0.35}As$ having a bandgap intermediate between those of the layers. This makes it possible to reduce the height of a barrier caused by a spike (a parasitic barrier) formed at the valence band edge. That is, the semiconductor laser device according to this embodiment makes it possible to reduce the bias voltage that should be applied between the first p-type cladding layer 16 and the second p-type cladding layer 17. Accordingly, the operating voltage of the semiconductor laser device can be reduced.

In addition, the semiconductor laser device is provided simultaneously with the improved efficiency of confining electrons to the active layer 14 and the effect of reducing the operating voltage of the semiconductor laser device. This makes it possible to prevent heat from being generated in the semiconductor laser device and thereby provide further increased output from the semiconductor laser device.

The semiconductor laser device according to this embodiment has a COD level of 350 mW or more, an operating voltage of 2.1V at 200 mW of optical output, and no phenomenon of thermal saturation observed up to 350 mW of optical output.

Now, with the semiconductor laser device according to this embodiment, discussed below is each potential difference between the layers from the optical guiding layer 15 to the second p-type cladding layer 17 in the conduction and valence bands. Also discussed below is how the potential difference affects the characteristics of the semiconductor laser device.

-Discussion of Potential Difference in Conduction Band-

Like the first embodiment, the semiconductor laser device according to this embodiment has a potential difference ΔEc of 390 meV between the conduction band edges of the active layer 14 and the second p-type cladding layer 17 for defining a barrier height. That is, the semiconductor laser device according to the present invention has a larger potential difference ΔEc between the p-type cladding layer (the second p-type cladding layer 17) and the active layer than the semiconductor laser device formed only of a prior-art $Al_xGa_{1-x}As$ based material. This is considered to contribute to the improvement in the efficiency of confining electrons to the active layer 14 in comparison with the prior-art semiconductor laser device.

-Discussion of the Height of a Barrier Caused by a Spike Formed in Valence Band- As shown in FIG. 7, consider the case where the first p-type cladding layer 16 of p-type $Al_{0.65}Ga_{0.35}As$ for relaxing a first spike is interposed between the optical guiding layer 15 and the second p-type cladding layer 17 for defining a barrier height. In this case, the spikes having the following barrier heights occur in the valence bands. The barrier height $V_{D16}$ caused by a spike formed between the optical guiding layer 15 and the first p-type cladding layer 16 is 0.130 eV. The barrier height $V_{D17}$ caused by a spike formed between the first p-type cladding layer 16 and the second p-type cladding layer 17 is 0.123 eV. These heights are smaller than a barrier height of 0.29 eV caused by the spike formed between the optical guiding layer 5 and the first p-type cladding layer 6 of the first embodiment where the first p-type cladding layer 16 is not employed. That is, this shows that the height of a barrier caused by a spike formed in the valence band can be reduced by the presence of the first p-type cladding layer 16 of p-type $Al_{0.65}Ga_{0.35}As$ interposed between the optical guiding layer 15 and the second p-type cladding layer 17.

In addition, as shown in the figure, between the layers disposed between the second p-type cladding layer 17 and the p-type contact layer 24, formed are a spike-caused barrier height $V_{D22}$, and band discontinuities ΔEv18, ΔEv19, ΔEV20, ΔEv23, and ΔEv24, respectively.

Incidentally, the spike-caused barrier height depends on the band discontinuity ΔEv and the impurity concentration at the valence band edge. However, in practice, it is almost impossible to change the impurity concentration to maintain the function of the laser device, and therefore the barrier height varies depending on the band discontinuity ΔEv at the valence band edge which is defined by the composition of the compound semiconductor.

On the other hand, the p-type cladding layer for relaxing the first spike needs not to be single but may be plural.

-Discussion of the Optimum Al Composition of the First p-type Cladding Layer 16-

Now, consideration is given to how to set the Al composition ratio x of the first p-type cladding layer 16 interposed between the optical guiding layer 15 and the second p-type cladding layer 17. In this consideration, p-type $Al_xGa_{1-x}As$ was used as the first p-type cladding layer 16 to examine the height of a barrier caused by a spike formed in the valence band with the Al composition ratio x being employed as a parameter. In this case, the p-type carrier density of the optical guiding layer 15 is pinned to $1\times10^{16}$ cm$^{-3}$, the carrier density of the first p-type cladding layer 16 to $7\times10^{17}$ cm$^{-3}$, and the carrier density of the second p-type cladding layer 17 to $7\times10^{17}$ cm$^{-3}$.

Figure 8:
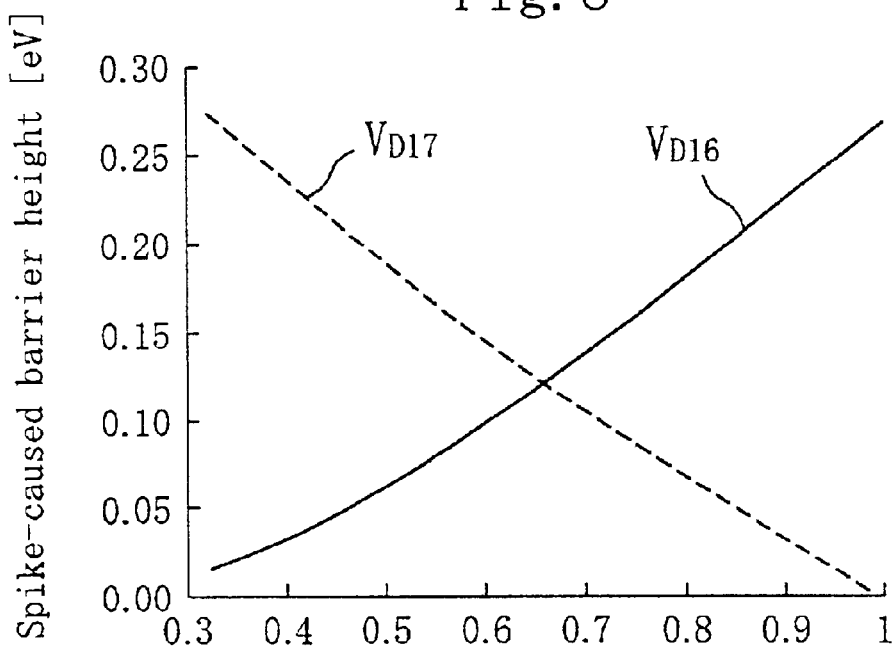
FIG. 8 is a view illustrating the relationship between the Al composition ratio of a first p-type cladding layer and the barrier height of a spike formed in the valence band in the semiconductor laser device according to the second embodiment.

FIG. 8 is a view illustrating the relationship between the Al composition ratio x of the first p-type cladding layer 16 and the barrier height caused by a spike formed in the valence band. Referring to the figure, the solid curve represents the barrier height $V_{D16}$ caused by the spike formed between the optical guiding layer 15 and the first p-type cladding layer 16. The broken curve represents the barrier height $V_{D17}$ caused by the spike formed between the first p-type cladding layer 16 and the second p-type cladding layer 17. Within the range where the first p-type cladding layer 16 has a relatively low Al composition ratio x, the barrier height $V_{D17}$ is larger than the barrier height $V_{D16}$. On the contrary, within the range where the first p-type cladding layer 16 has a relatively high Al composition ratio x, the barrier height $V_{D16}$ is larger than the barrier height $V_{D17}$. To make the operating voltage (a threshold voltage) as low as possible, it is preferable that the maximum value of the barrier heights $V_{D16}$, $V_{D17}$ is minimal. Therefore, the Al composition ratio x of the first p-type cladding layer 16 may be set to around x=0.65, where the barrier heights $V_{D16}$, $V_{D17}$ are equal to each other.

-Discussion of Effects of the Depletion Layers Formed in the First p-type Cladding Layer 16 and the Second p-type Cladding Layer 17-

Figure 9:
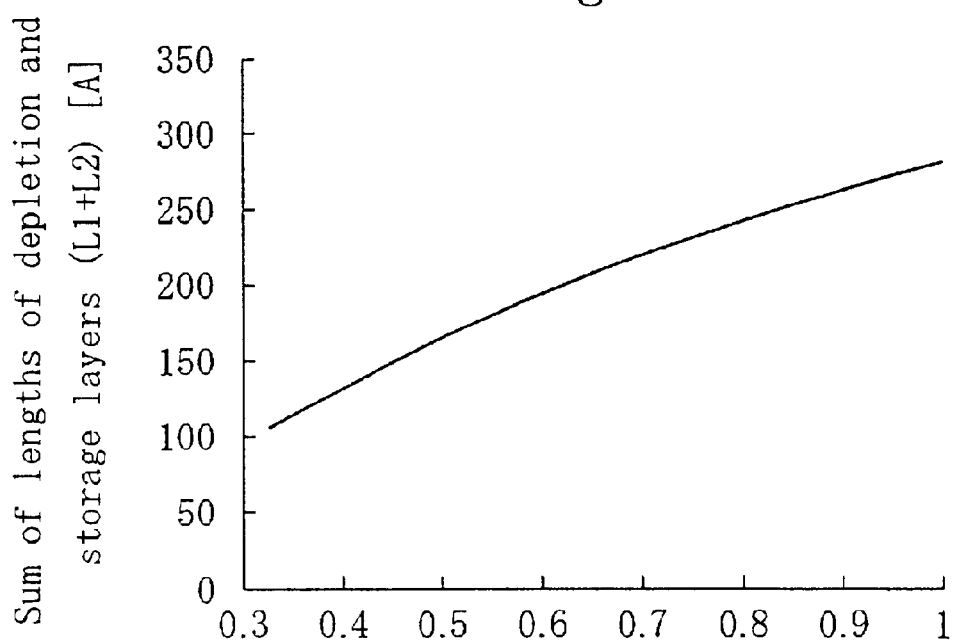
FIG. 9 is a view illustrating the relationship between the Al composition ratio of the first p-type cladding layer and the total length of the depletion layer and the storage layer in the semiconductor laser device according to the second embodiment.

FIG. 9 is a view illustrating the relationship between the Al composition ratio x of the first p-type cladding layer 16 and the sum (L1+L2) of the length L1 of the depletion layer formed in the first p-type cladding layer 16 (see FIG. 7) and the length L2 of the storage layer (see FIG. 7). As can be seen from FIG. 9, L1+L2=21 nm when x=0.65 is selected to reduce the operating voltage (the threshold voltage). It is preferable to provide the maximal height of a barrier to electrons formed in the conduction band in order to improve the efficiency of confining electrons to the active layer 14. However, a thickness of the first p-type cladding layer 16 thinner than (L1+L2) would make it impossible in practice to provide the maximal height of a barrier to electrons due to the effects of the internal electric field of the depletion layer and the storage layer. It is therefore preferable to provide the first p-type cladding layer 16 with a thickness of (L1+L2). In this context, in the semiconductor laser device according to this embodiment, the first p-type cladding layer 16 has a thickness of 25 nm.

Likewise, it is preferable to determine the thickness of the second p-type cladding layer 17 in consideration of the sum of the length L3 of the depletion layer and the length L4 of the storage layer (see FIG. 7), which are formed therein. Under the conditions of this embodiment, the sum of the length L3 of the depletion layer and the length L4 of the storage layer which are formed in the second p-type cladding layer 17 is L3+L4=36 nm. When a second p-type cladding layer 17 is provided which has a thickness equal to or less than (L3+L4), it is impossible to provide a maximal height of a barrier to electrons due to the effects caused by the internal electric fields. In this context, in the semiconductor laser device according to this embodiment, the second p-type cladding layer 17 has a thickness of 40 nm.

-Relationship Between the Al Composition Ratio x of the First p-type Cladding Layer 16 and the Operating Voltage of the Semiconductor Laser Device- With the first p-type cladding layer 16 of p-type $Al_xGa_{1-x}As$ being interposed between the optical guiding layer 15 and the second p-type cladding layer 17, consideration was given to how the threshold voltage of the semiconductor laser device varied. As described above, the consideration showed that the operating voltage was minimal at around x=0.65 with the voltage being equal to 2.1V.

Now, discussions are made below as to how the potential differences in the valence band from the second p-type cladding layer 17 to the p-type contact layer 24 affect the characteristics of the semiconductor laser device.

There exist a potential difference ÃEv of about 0.5 eV in the valence band between the second p-type cladding layer 17 and the p-type contact layer 24. Therefore, with the p-type contact layer 24 being formed in direct contact with the second p-type cladding layer 17, holes having flown from the p-electrode require a large bias voltage to surmount this barrier. It is thus desirable to insert a plurality of p-type layers in between the second p-type cladding layer 17 and the p-type contact layer 24, thereby reducing the overall ΔEv. In this context, the semiconductor laser device according to this embodiment has the third p-type cladding layer 18, the fourth p-type cladding layer 19, the etch stop layer 20, the fifth p-type cladding layer 22, and the sixth p-type cladding layer 23, which are inserted in between the second p-type cladding layer 17 and the p-type contact layer 24. Consequently, the barrier height V or the band discontinuity ΔEv is 0.15 eV or less which is caused by each of the spikes formed between the second p-type cladding layer 17 and the p-type contact layer 24 in the semiconductor laser device according to this embodiment.

Incidentally, it is not always necessary to provide three p-type cladding layers for relaxing the second spike. One, two, or four or more p-type cladding layers for relaxing the second spike may be provided.

Incidentally, the semiconductor laser device according to this embodiment can be provided with the following layers between the optical guiding layer 15 and the second p-type cladding layer 17 instead of the first p-type cladding layer 16 to reduce the height of the spikes in the valence band. That is, it is possible to use two or more p-type cladding layers of p-type $Al_xGa_{1-x}As$ having a stepwise graded Al composition ratio x or a p-type cladding layer of p-type $Al_xGa_{1-x}As$ having a generally continuously graded Al composition ratio x.

Third Embodiment

Figure 10:
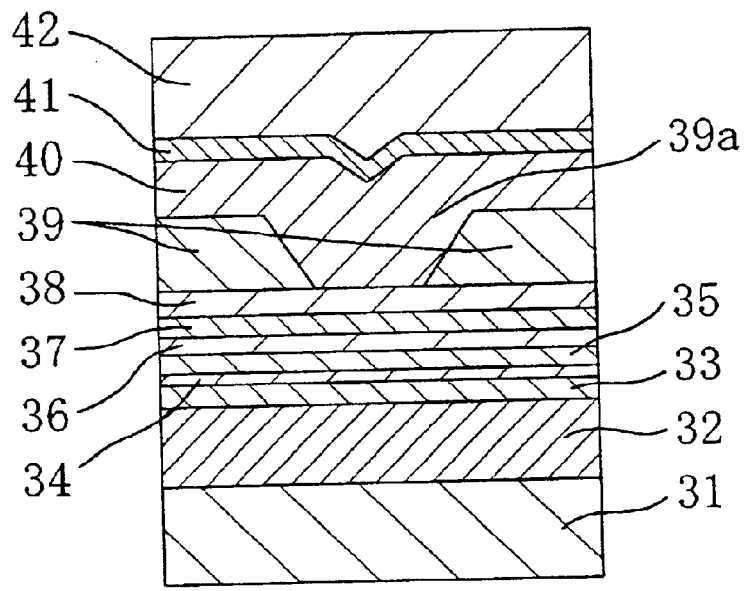
FIG. 10 is a cross-sectional view illustrating a semiconductor laser device, in a direction orthogonal to that of the stripe, according to a third embodiment of the present invention.

FIG. 10 is a cross-sectional view illustrating a semiconductor laser device, in a direction orthogonal to that of the stripe, according to a third embodiment of the present invention.

As shown in the figure, the semiconductor laser device according to this embodiment has the following layers which are sequentially formed on an n-type GaAs substrate 31. The layers include an n-type cladding layer 32 of n-type $Al_{0.5}Ga_{0.5}As$ 3 μm in thickness, an optical guiding layer 33 of $Al_{0.3}Ga_{0.7}As$ 50 nm in thickness, a single quantum well active layer 34 of GaAs 3 nm in thickness, an optical guiding layer 35 of $Al_{0.3}Ga_{0.7}As$ 50 nm in thickness, a first p-type cladding layer 36 of p-type $(Al_{0.2}Ga_{0.8})_{0.5}In_{0.5}P$ 25 nm in thickness for relaxing a first spike, a second p-type cladding layer 37 of p-type $(Al_{0.7}Ga_{0.3})_{0.5}In_{0.5}P$ 40 nm in thickness for defining a barrier height, a third p-type cladding layer 38 of p-type $(Al_{0.65}Ga_{0.35})_{0.5}In_{0.5}P$ 40 nm in thickness, a current blocking layer 39 of n-type $Al_{0.7}Ga_{0.3}As$ 700 nm in thickness having a stripe-shaped window portion 39a, a fifth p-type cladding layer 40 of p-type $Al_{0.5}Ga_{0.5}As$ having a maximum thickness of 2.5 μm for filling in the window portion 39a of the current blocking layer 39 and extending over the current blocking layer 39, a sixth p-type cladding layer 41 of p-type $Al_{0.25}Ga_{0.75}As$ 40 nm in thickness, and a p-type contact layer 42 of p-type GaAs 2.5 μm in thickness. Although not shown, an n-type electrode is provided on the reverse side of the n-type GaAs substrate 31 and a p-electrode on the p-type contact layer 42, respectively.

Figure 11:
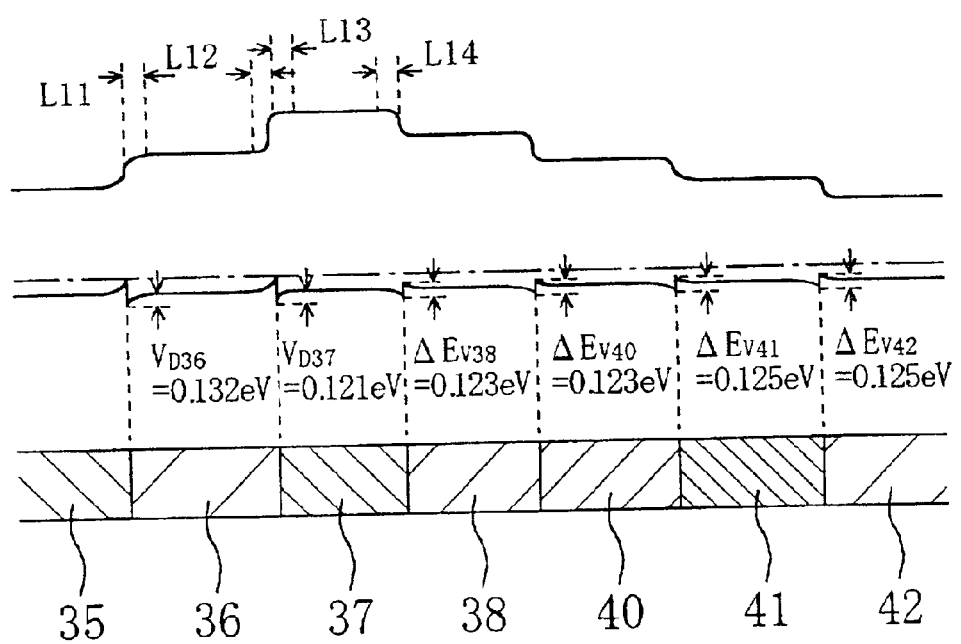
FIG. 11 is an energy band diagram of the conduction and valence bands from the optical guiding layer to the p-type contact layer in the semiconductor laser device according to the third embodiment.

FIG. 11 is an energy band diagram of the conduction and valence bands from the optical guiding layer 35 to the p-type contact layer 42 in the semiconductor laser device according to this embodiment. Incidentally, in FIG. 11, only for ease of understanding the band structure, each of the layers except for the active layer is expressed to be generally uniform in thickness, and the active layer 34 and the optical guiding layer 33 are not illustrated. As shown in the figure, between the optical guiding layer 35 and the second p-type cladding layer 37 of p-type $(Al_{0.7}Ga_{0.3})_{0.5}In_{0.5}P$, provided is the first cladding layer 36 of p-type $(Al_{0.2}Ga_{0.8})_{0.5}In_{0.5}P$ having a bandgap greater than that of the optical guiding layer 35 and less than that of the second p-type cladding layer 37. In this structure, the optical guiding layer 35 has a density of $1 \times 10^{16}$ cm$^{-3}$ of p-type carriers, the first p-type cladding layer 36 has a carrier density of $7 \times 10^{17}$ cm$^{-3}$, and the second p-type cladding layer 37 has a carrier density of $7 \times 10^{17}$ cm$^{-3}$.

As shown in FIG. 11, spikes (parasitic barriers) formed at the interface between the optical guiding layer 35 and the first p-type cladding layer 36 and between the first p-type cladding layer 36 and the second p-type cladding layer 37 have barrier heights of $V_{D36}$ and $V_{D37}$, respectively. That is, although not shown in FIG. 5, a large spike is also formed at the valence band edge between the optical guiding layer 5 and the first p-type cladding layer 6 in the first embodiment. This embodiment has relaxed the large spike at the valence band edge by two smaller spikes.

In addition, as shown in the figure, between the layers disposed between the second p-type cladding layer 37 and the p-type contact layer 42, formed are band discontinuities ΔEv38, ΔEv40, ΔEv41, and ΔEv42 which are caused by a spike, respectively.

Incidentally, the spike-caused barrier height depends on the band discontinuity ΔEv and the impurity concentration at the valence band edge. However, in practice, it is almost impossible to change the impurity concentration to maintain the function of the laser device, and therefore the barrier height varies depending on the band discontinuity ΔEv at the valence band edge which is defined by the composition of the compound semiconductor.

On the other hand, the p-type cladding layer for relaxing the first spike needs not to be single but may be plural.

Of the members forming the aforementioned semiconductor laser device, the compound semiconductor layers are grown using the metal organic vapor phase epitaxial (hereinafter referred to as the MOVPE) equipment in the same way in principle as in the first embodiment.

On the other hand, the epitaxial substrate is cleaved into laser chips having a length of 800 μm in the direction of the resonator cavity or the stripe. The two mutually opposite cleaved facets of a laser chip or so-called end faces are coated with a multi-layered film of amorphous silicon and $SiO_2$ as an end face protective coating. In addition, to obtain high optical power output, the end faces are coated asymmetrically such that the rear facet of the laser chip has a high reflectivity (90%) and the front facet of the laser chip has a low reflectivity (10%).

According to the semiconductor laser device of this embodiment, like the first and second embodiments, the second p-type cladding layer 37 is formed of p-type $(Al_{0.7}Ga_{0.3})_{0.5}In_{0.5}P$. As described in the first embodiment, this makes it possible to provide a large potential difference ΔEc between the conduction bands of the active layer 34 and the second p-type cladding layer 37. Thus, like in the first and second embodiments, the semiconductor laser device according to this embodiment makes it possible to improve the efficiency of confining electrons to the active layer 34 and thereby provide increased optical output.

In addition to this, employed between the optical guiding layer 35 and the second p-type cladding layer 37 is the first p-type cladding layer 36 of p-type $(Al_{0.2}Ga_{0.8})_{0.5}In_{0.5}P$ having a bandgap intermediate between those of the layers. Like in the second embodiment, this makes it possible to reduce the height of a barrier caused by a spike formed in the valence band. That is, the semiconductor laser device according to this embodiment makes it possible to reduce the bias voltage that should be applied between the first p-type cladding layer 36 and the second p-type cladding layer 37. Accordingly, the operating voltage of the semiconductor laser device can be reduced.

In addition, the semiconductor laser device is provided simultaneously with the improved efficiency of confining electrons to the active layer 34 and the effect of reducing the operating voltage of the semiconductor laser device. This makes it possible to prevent heat from being generated in the semiconductor laser device and thereby provide further increased output from the semiconductor laser device.

Furthermore, in the second embodiment, it was necessary to provide the etch stop layer 20 of AlGaAs ($Al_{0.2}Ga_{0.8}As$ having a low Al composition ratio x) as a film for allowing selective etching in conjunction with the current blocking layer 21 of $Al_{0.7}Ga_{0.3}As$ upon etching to form the window portion 21a of the current blocking layer 21. In contrast to this, this embodiment is provided with the third p-type cladding layer 38 of $(Al_{0.65}Ga_{0.35})_{0.5}In_{0.5}P$, thereby facilitating the selective etching in conjunction with the current blocking layer 39 of AlGaAs. As described later in detail, in the second embodiment, the etch stop layer 20 varies in thickness by etching to cause a considerable variation in beam divergence angle. However, this embodiment makes it possible to reduce such a variation in beam divergence angle.

The semiconductor laser device according to this embodiment has a catastrophic optical damage (COD) level of 350 mW or more, an operating voltage of 2.1V at 200 mW of optical output, and no phenomenon of thermal saturation observed up to 350 mW of optical output.

Now, with the semiconductor laser device according to this embodiment, discussed below is each potential difference between the layers from the optical guiding layer 35 to the second p-type cladding layer 37 in the conduction and valence bands. Also discussed below is how the potential difference affects the characteristics of the semiconductor laser device.

-Discussion of Barrier Height Caused by a Spike Formed in the Valence Band-

As shown in FIG. 11, consider the case where the first p-type cladding layer 36 of p-type $(Al_{0.2}Ga_{0.8})_{0.5}In_{0.5}P$ is interposed between the optical guiding layer 35 and the second p-type cladding layer 37. In this case, the spikes having the following barrier heights occur in the valence bands. The barrier height $V_{D36}$ caused by a spike formed between the optical guiding layer 35 and the first p-type cladding layer 36 is 0.132 eV. The barrier height $V_{D37}$ caused by a spike formed between the first p-type cladding layer 36 and the second p-type cladding layer 37 is 0.121 eV. These heights are smaller than a barrier height of 0.29 eV caused by the spike formed between the optical guiding layer 5 and the first p-type cladding layer 6 of the first embodiment where the first p-type cladding layer 16 is not employed. That is, this shows that the height of a barrier caused by a spike formed in the valence band can be reduced by the presence of the first p-type cladding layer 36 of p-type $Al_{0.65}Ga_{0.35}As$ interposed between the optical guiding layer 35 and the second p-type cladding layer 37.

-Discussion of the Optimum Al Composition of the First p-type Cladding Layer 36-

Now, consideration is given to how to set the Al composition ratio x of the first p-type cladding layer 36 interposed between the optical guiding layer 35 and the second p-type cladding layer 37. In this consideration, p-type $Al_xGa_{1-x}As$ was used as the first p-type cladding layer 36 to examine the height of a barrier caused by a spike formed in the valence band with the Al composition ratio x being employed as a parameter. In this case, the p-type carrier density of the optical guiding layer 35 is pinned to $1 \times 10^{16}$ cm$^{-3}$, the carrier density of the first p-type cladding layer 36 to $7 \times 10^{17}$ cm$^{-3}$ and the carrier density of the second p-type cladding layer 37 to $7 \times 10^{17}$ cm$^{-3}$.

Figure 12:
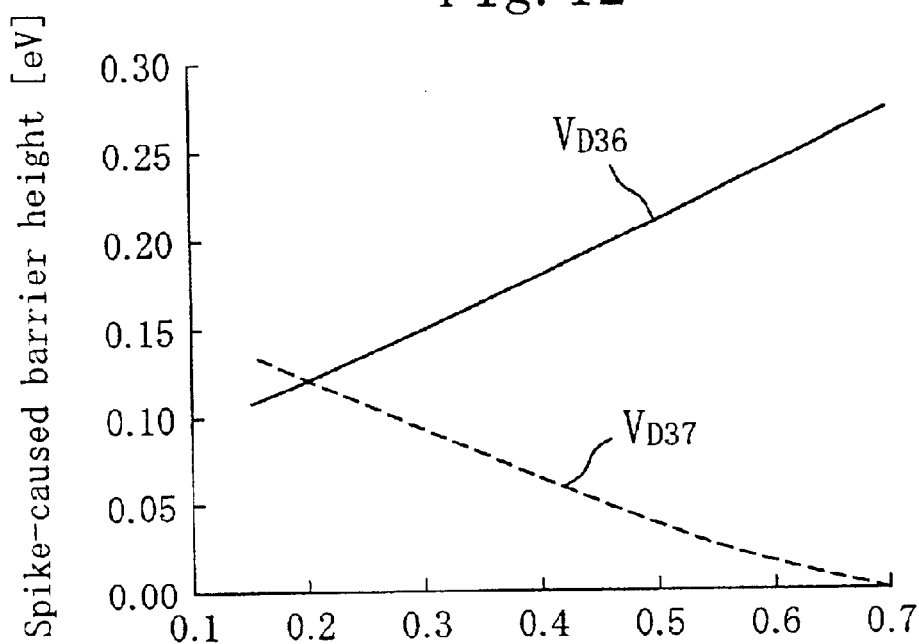
FIG. 12 is a view illustrating the relationship between the Al composition ratio of a first p-type cladding layer and the barrier height of a spike formed in the valence band in the semiconductor laser device according to the third embodiment.

FIG. 12 is a view illustrating the relationship between the Al composition ratio x of the first p-type cladding layer 36 and the barrier height by a spike formed in the valence band. Referring to the figure, the solid curve represents the barrier height $V_{D36}$ caused by the spike formed between the optical guiding layer 35 and the first p-type cladding layer 36. The broken curve represents the barrier height $V_{D37}$ caused by the spike formed between the first p-type cladding layer 36 and the second p-type cladding layer 37. Within the range where the first p-type cladding layer 36 has a relatively low Al composition ratio x, the barrier height $V_{D37}$ is larger than the barrier height $V_{D36}$. On the contrary, within the other ranges, the spike-caused barrier height $V_{D36}$ is larger than the spike-caused barrier height $V_{D37}$. To make the operating voltage (a threshold voltage) as low as possible, it is preferable that the maximum value of the barrier heights $V_{D36}$, $V_{D37}$, caused by each spike, is minimal. Therefore, the Al composition ratio x of the first p-type cladding layer 36 may be set to around x=0.2, where the barrier heights $V_{D36}$, $V_{D37}$, caused by each spike, are equal to each other.

-Discussion of Effects of the Depletion Layers Formed in the First p-type Cladding Layer 36 and the Second p-type Cladding Layer 37-

Figure 13:
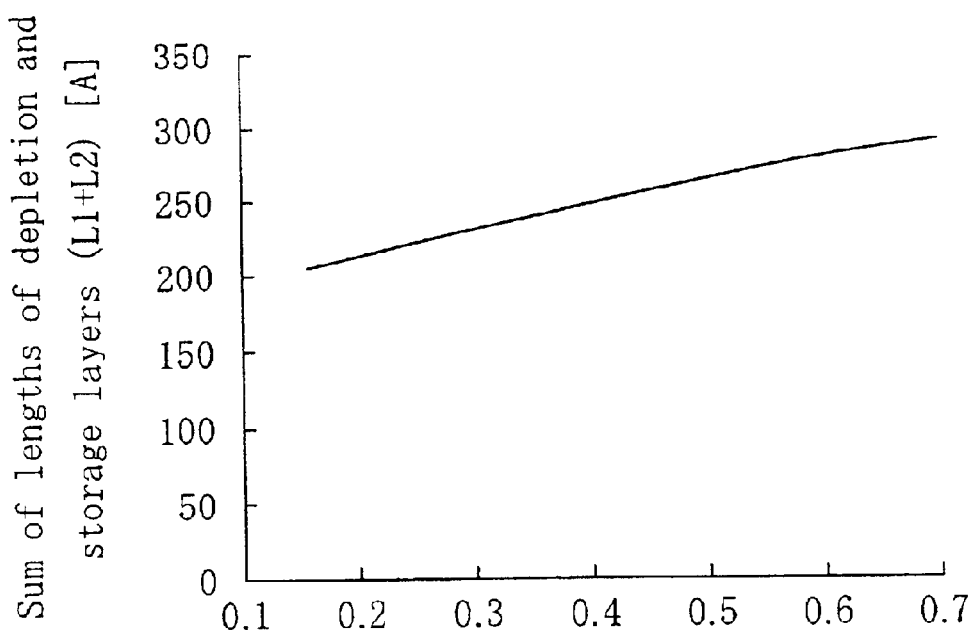
FIG. 13 is a view illustrating the relationship between the Al composition ratio of the first p-type cladding layer and the total length of the depletion layer and the storage layer in the semiconductor laser device according to the third embodiment.

FIG. 13 is a view illustrating the relationship between the Al composition ratio x of the first p-type cladding layer 36 and the sum (L11+L12) of the length L11 of the depletion layer formed in the first p-type cladding layer 36 (see FIG. 11) and the length L12 of the storage layer (see FIG. 11). As can be seen from FIG. 13, L11+L12=21 nm when x=0.2 is selected to reduce the operating voltage (the threshold voltage). It is preferable to provide the maximal height of a barrier to electrons formed in the conduction band in order to improve the efficiency of confining electrons to the active layer 34. However, a thickness of the first p-type cladding layer 36 thinner than (L11+L12) would make it impossible in practice to provide the maximal height of a barrier to electrons due to the effects of the internal electric field of the depletion layer and the storage layer. It is therefore preferable to provide the first p-type cladding layer 36 with a thickness of (L11+L12). In this context, in the semiconductor laser device according to this embodiment, the first p-type cladding layer 36 has a thickness of 25 nm.

Likewise, it is preferable to determine the thickness of the second p-type cladding layer 37 in consideration of the sum of the length L13 of the depletion layer and the length L14 of the storage layer (see FIG. 11), which are formed therein. Under the conditions of this embodiment, the sum of the length L13 of the depletion layer and the length L14 of the storage layer which are formed in the second p-type cladding layer 37 is L13+L14=36 nm. When a second p-type cladding layer 37 is provided which has a thickness equal to or less than (L13+L14), it is impossible to provide a maximal height of a barrier to electrons due to the effects caused by the internal electric fields. In this context, in the semiconductor laser device according to this embodiment, the second p-type cladding layer 37 has a thickness of 40 nm.

-Relationship Between the Al Composition Ratio x of the First p-type Cladding Layer 36 and the Operating Voltage of the Semiconductor Laser Device- With the first p-type cladding layer 36 of p-type $(Al_xGa_{1-x})_{0.5}In_{0.5}P$ being interposed between the optical guiding layer 35 and the second p-type cladding layer 37, consideration was given to how the operating voltage of the semiconductor laser device varied. The consideration showed that the operating voltage was minimal at around y=0.20 with the voltage being equal to 2.1V.

Now, discussions are made below as to how the potential differences in the valence band from the second p-type cladding layer 37 to the p-type contact layer 42 affect the characteristics of the semiconductor laser device.

There exist a potential difference ΔEv of about 0.5 eV in the valence band between the second p-type cladding layer 37 and the p-type contact layer 42. Therefore, with the p-type contact layer 42 being formed in direct contact with the second p-type cladding layer 37, holes having flown from the p-electrode require a large bias voltage to surmount this barrier. It is thus desirable to insert a plurality of p-type layers in between the second p-type cladding layer 37 and the p-type contact layer 42, thereby reducing the overall ΔEv. In this context, the semiconductor laser device according to this embodiment has the third p-type cladding layer 38, the fifth p-type cladding layer 40, and the sixth p-type cladding layer 41, which are inserted in between the second p-type cladding layer 37 and the p-type contact layer 24 and each of which functions as a p-type contact layer for relaxing the second spike. Consequently, as shown in FIG. 11, the barrier height V or the band discontinuity ΔEv is 0.15 eV or less which is caused by each of the spikes formed between the second p-type cladding layer 37 and the p-type contact layer 42 in the semiconductor laser device according to this embodiment.

Incidentally, it is not always necessary to provide three p-type cladding layers for relaxing the second spike. One, two, or four or more p-type cladding layers for relaxing the second spike may be provided.

Incidentally, in the structure of the semiconductor laser device shown in this embodiment, it is not necessary to provide the etch stop layer which is shown in the semiconductor laser device according to the second embodiment. This is because the third p-type cladding layer 38 has the function of an etch stop layer. In the semiconductor laser device according to the second embodiment, provided is the etch stop layer 20 of AlGaAs ($Al_{0.2}Ga_{0.8}As$) having a low Al composition ratio x and underlying the current blocking layer 21 of AlGaAs. With this structure, use is made of the difference in etching rate caused by the difference in composition of aluminum between the current blocking layer 21 and the etch stop layer 20 or the etching selection ratio to perform a selective etching on the current blocking layer 21. However, in the first embodiment, since the current blocking layer 21 and the etch stop layer 20 are formed of the same AlGaAs-based material, a high etching selection ratio could not be obtained, thereby causing a portion of the etch stop layer 20 located at the window portion of the current blocking layer to be slightly thinner after the selective etching. In some cases, this resulted in variations in beam divergence angle of the semiconductor laser device, thereby reducing manufacturing yields. In contrast to this, this embodiment is provided with the third p-type cladding layer 38 and the current blocking layer 39 which are formed of AlGaInP and AlGaAs that are different from each other. Accordingly, this makes it possible to provide a high etching selection ratio between the third p-type cladding layer 38 and the current blocking layer 39, thereby preventing variations in thickness of the third p-type cladding layer 38. This serves to reduce variations in beam divergence angle caused by a variation in thickness of the third p-type cladding layer 38, thereby providing improved yields for the semiconductor laser device. For example, the semiconductor laser device according to the second embodiment of the present invention provides a variation width of one degree for both horizontal and vertical divergence angles. In contrast, the semiconductor laser device according to this embodiment provides a variation width of 0.5 degrees or less for both horizontal and vertical divergence angles.

Incidentally, the semiconductor laser device according to this embodiment can be provided with the following layers between the optical guiding layer 35 and the second p-type cladding layer 37 instead of the first p-type cladding layer 36 to reduce the height of the spikes in the valence band. That is, it is possible to use two or more p-type cladding layers of p-type $(Al_xGa_{1-x})_{0.5}In_{0.5}P$ having a stepwise graded Al composition ratio x or a p-type cladding layer of p-type $(Al_xGa_{1-x})_{0.5}In_{0.5}P$ having a generally continuously graded Al composition ratio x.

Fourth Embodiment

Figure 14:
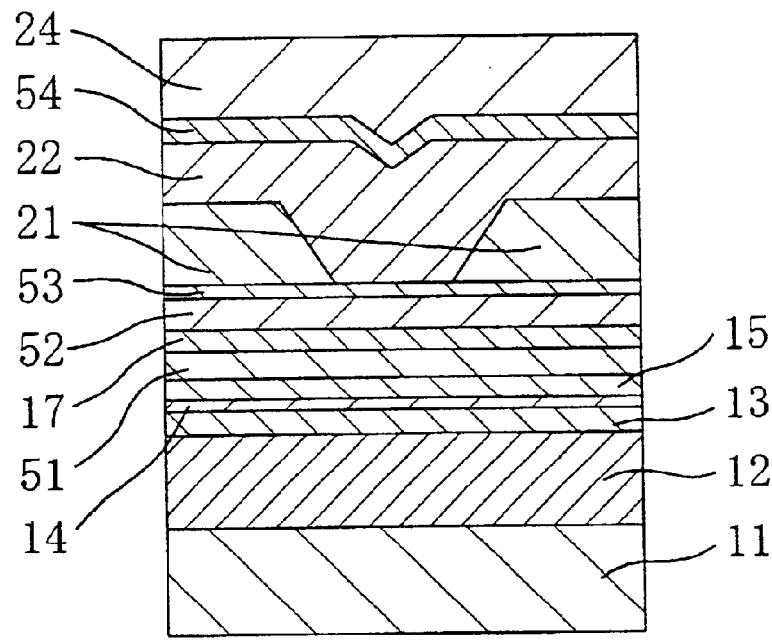
FIG. 14 is a cross-sectional view illustrating a semiconductor laser device, in a direction orthogonal to that of the stripe, according to a fourth embodiment of the present invention.

FIG. 14 is a cross-sectional view illustrating a semiconductor laser device, in a direction orthogonal to that of the stripe, according to a fourth embodiment of the present invention. As shown in the figure, the semiconductor laser device according to this embodiment is constructed using the following layers in the semiconductor laser device of the second embodiment. That is, instead of the first cladding layer 16 for relaxing the first spike, used is a first p-type cladding layer 51 of $Al_{z1}Ga_{1-z1}As$ 30 nm in thickness having a continuously graded Al composition ratio z1. Instead of the third p-type cladding layer 18 for relaxing the second spike and the fourth p-type cladding layer 19, used is a third p-type cladding layer 52 of $Al_{z2}Ga_{1-z2}As$ 40 nm in thickness having a continuously graded Al composition ratio z2. Furthermore, an etch stop layer 53 of p-type $Al_{0.2}Ga_{0.8}As$ 10 nm in thickness is used instead of the etch stop layer 20, and a sixth p-type cladding layer 54 of $Al_{z3}Ga_{1-z3}As$ 40 nm in thickness having a continuously graded Al composition ratio z3 is used instead of the sixth p-type cladding layer 23. Other components of the semiconductor laser device according to this embodiment are the same as those of the semiconductor laser device according to the second embodiment. The components are given the same reference numerals as those of FIG. 6 and will not be explained repeatedly.

Incidentally, the Al composition ratio z1 of the first p-type cladding layer 51 was varied from 0.3 to 1 in general proportion to the position of the thickness of the first p-type cladding layer 51 from the optical guiding layer 15 to the second p-type cladding layer 17. In addition, the Al composition ratio z2 of the third p-type cladding layer 52 was varied from 1 to 0.2 in general proportion to the position of the thickness of the third p-type cladding layer 52 from the second p-type cladding layer 17 to the etch stop layer 53. Furthermore, the Al composition ratio z3 of the sixth p-type cladding layer 54 was varied from 0.5 to 0 in general proportion to the position of the thickness of the sixth p-type cladding layer 54 from the fifth p-type cladding layer 22 to the p-type contact layer 24.

The semiconductor laser device according to this embodiment employs the first p-type cladding layer 51 of $Al_{z1}Ga_{1-z1}As$ having a continuously graded Al composition ratio z1. This makes it possible to provide a reduced barrier height or a band discontinuity caused by a spike formed at the valence band edge. Therefore, it is made possible to reduce the bias voltage that should be applied between the first p-type cladding layer 51 and the second p-type cladding layer 17. Accordingly, the operating voltage of the semiconductor laser device can be reduced.

In addition, the semiconductor laser device according to this embodiment employs the third p-type cladding layer 52 of $Al_{z2}Ga_{1-z2}As$ having a continuously graded composition ratio z2 and the sixth p-type cladding layer 54 of $Al_{z3}Ga_{1-z3}As$ having a continuously graded composition ratio z3. This makes it possible to reduce generally to zero the barrier height caused by a spike formed in the valence band at the following interfaces from the second p-type cladding layer 17 to the p-type contact layer 24. That is, the interfaces are located between the third p-type cladding layer 52 and the second p-type cladding layer 17, between the third p-type cladding layer 52 and the etch stop layer 53, between the sixth p-type cladding layer 54 and the fifth p-type cladding layer 22, and between the sixth p-type cladding layer 54 and the p-type contact layer 24.

Figure 15:
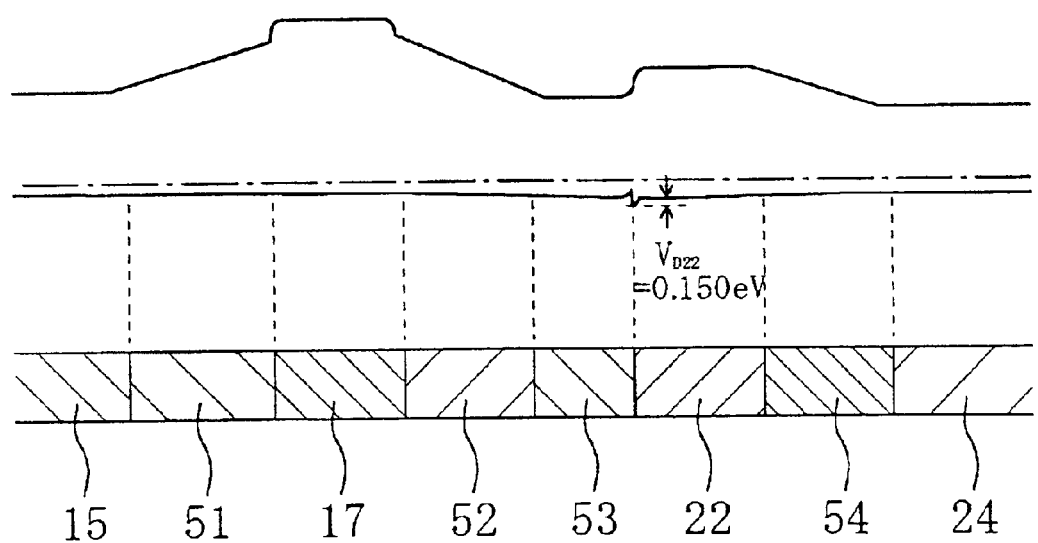
FIG. 15 is an energy band diagram of the conduction and valence bands from the optical guiding layer to the p-type contact layer in the semiconductor laser device according to this embodiment.

FIG. 15 is an energy band diagram of the conduction and valence bands from the optical guiding layer 15 to the p-type contact layer 24 in the semiconductor laser device according to this embodiment. As shown in the figure, for the semiconductor laser device according to this embodiment, it can be said that almost no spikes are formed at valence band edges except for the spike having a height of $V_{D22}=0.150$ eV formed at the valence band edge between the etch stop layer 53 and the fifth p-type cladding layer 22.

The semiconductor laser device according to this embodiment has a catastrophic optical damage (COD) level of 350 mW or more and no phenomenon of thermal saturation observed up to 350 mW of optical output. In addition, the semiconductor laser device according to this embodiment has an operating voltage of 2.0V at 200 mW of optical output. Thus, it was made possible to reduce the operating voltage by 0.1V in comparison with the semiconductor laser device according to the second embodiment. This embodiment has made it possible to reduce the operating voltage by 0.1V in comparison with the semiconductor laser device according to the second embodiment. This is conceivable because this embodiment has employed the first p-type cladding layer 51, the third p-type cladding layer 52, and the sixth p-type cladding layer 54, thereby making almost zero the barrier height V caused by a spike formed in the valence band or the band discontinuity ΔEv. It is considered that, among other things, the first p-type cladding layer 51, which can provide the most reduced barrier height of ΔEv caused by a spike formed in the valence band, contributes to the reduction of the operating voltage.

Fifth Embodiment

Figure 16:
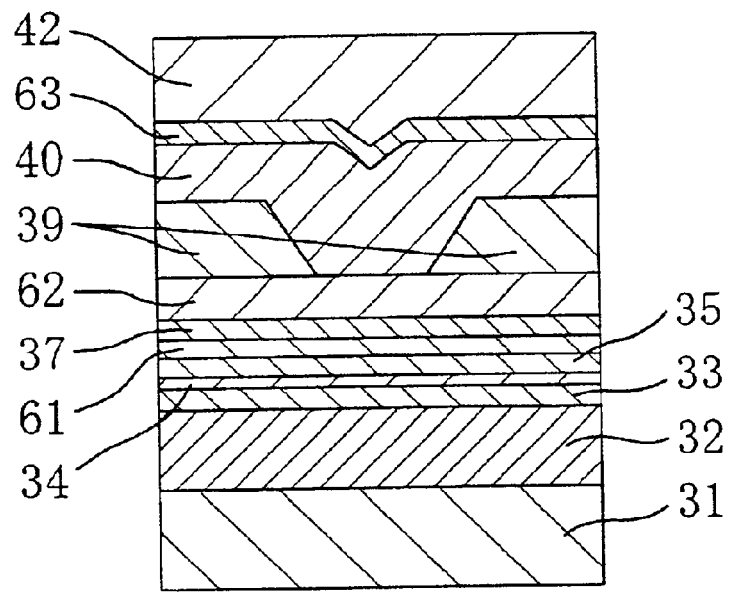
FIG. 16 is a cross-sectional view illustrating a semiconductor laser device, in a direction orthogonal to that of the stripe, according to a fifth embodiment of the present invention.

FIG. 16 is a cross-sectional view illustrating a semiconductor laser device, in a direction orthogonal to that of the stripe, according to a fifth embodiment of the present invention. As shown in the figure, the semiconductor laser device according to this embodiment is constructed using the following layers in the semiconductor laser device of the third embodiment. That is, instead of the first cladding layer 36 for relaxing the first spike, used is a first p-type cladding layer 61 of p-type $(Al_{t1}Ga_{1-t1})_{0.5}In_{0.5}P$ 30 nm in thickness having a continuously graded Al composition ratio t1. Instead of the third p-type cladding layer 38 for relaxing the second spike, used is a third p-type cladding layer 62 of p-type $(Al_{t2}Ga_{1-t2})_{0.5}In_{0.5}P$ 40 nm in thickness having a continuously graded Al composition ratio t2. Furthermore, a sixth p-type cladding layer 63 of $Al_{t3}Ga_{1-t3}As$ 40 nm in thickness having a continuously graded Al composition ratio t3 is used instead of the sixth p-type cladding layer 41 for relaxing the second spike. Other components of the semiconductor laser device according to this embodiment are the same as those of the semiconductor laser device according to the third embodiment. The components are given the same reference numerals as those of FIG. 6 and will not be explained repeatedly.

Incidentally, the Al composition ratio t1 of the first p-type cladding layer 61 was varied from 0.15 to 0.7 in general proportion to the position of the thickness of the first p-type cladding layer 61 from the optical guiding layer 35 to the second p-type cladding layer 37. In addition, the Al composition ratio t2 of the third p-type cladding layer 62 was varied from 0.7 to 0 in general proportion to the position of the thickness of the third p-type cladding layer 62 from the second p-type cladding layer 37 to the fifth p-type cladding layer 40. Furthermore, the Al composition ratio t3 of the sixth p-type cladding layer 63 was varied from 0.5 to 0 in general proportion to the position of the thickness of the sixth p-type cladding layer 63 from the fifth p-type cladding layer 40 to the p-type contact layer 42.

The semiconductor laser device according to this embodiment employs the first p-type cladding layer 61 of p-type $(Al_{t1}Ga_{1-t1})_{0.5}In_{0.5}P$ having a continuously graded Al composition ratio t1. This makes it possible to provide a reduced barrier height V or a band discontinuity ΔEv caused by a spike formed in the valence band. Consequently, it is made possible to reduce the bias voltage that should be applied between the first p-type cladding layer 61 and the second p-type cladding layer 37. Accordingly, the operating voltage of the semiconductor laser device can be reduced.

In addition, the semiconductor laser device according to this embodiment employs the third p-type cladding layer 62 of p-type $(Al_{t2}Ga_{1-t2})_{0.5}In_{0.5}P$ having a continuously graded composition ratio t2 and the sixth p-type cladding layer 63 of $Al_{t3}Ga_{1-t3}$ having a continuously graded composition ratio t3. This makes it possible to reduce generally to zero the barrier height V caused by a spike formed in the valence band or the band discontinuity ΔEv at the following interfaces from the second p-type cladding layer 37 to the p-type contact layer 42. That is, the interfaces are located between the third p-type cladding layer 62 and the second p-type cladding layer 37, between the third p-type cladding layer 62 and the fifth p-type cladding layer 40, between the sixth p-type cladding layer 63 and the fifth p-type cladding layer 40, and between the sixth p-type cladding layer 63 and the p-type contact layer 42.

Figure 17:
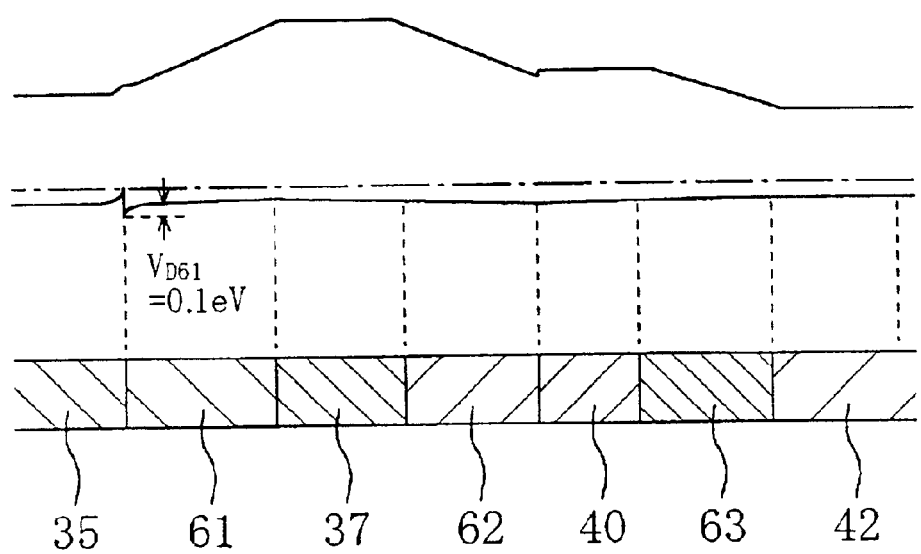
FIG. 17 is an energy band diagram of the conduction and valence bands from the optical guiding layer to the p-type contact layer in the semiconductor laser device according to the fifth embodiment.

FIG. 17 is an energy band diagram of the conduction and valence bands from the optical guiding layer 35 to the p-type contact layer 42 in the semiconductor laser device according to this embodiment. As shown in the figure, for the semiconductor laser device according to this embodiment, it can be said that almost no spikes are formed at valence band edges except for the spike having a height of $V_{D61}=0.1$ eV at the valence band edge between the optical guiding layer 35 and the first p-type cladding layer 61.

The semiconductor laser device according to this embodiment has a catastrophic optical damage (COD) level of 350 mW or more and no phenomenon of thermal saturation observed up to 350 mW of optical output. In addition, the semiconductor laser device according to this embodiment has an operating voltage of 2.0V at 200 mW of optical output. Thus, it was made possible to reduce the operating voltage by 0.1V in comparison with the semiconductor laser device according to the third embodiment. This embodiment has made it possible to reduce the operating voltage by 0.1V in comparison with the semiconductor laser device according to the third embodiment. This is conceivable because this embodiment has employed the first p-type cladding layer 61, the third p-type cladding layer 62, and the sixth p-type cladding layer 63, thereby making almost zero the barrier height V caused by a spike formed in the valence band or the band discontinuity ΔEv. It is considered that, among other things, the first p-type cladding layer 61, which can provide the most reduced barrier height caused by a spike formed in the valence band, contributes to the reduction of the operating voltage.

Sixth Embodiment

The present invention has been explained with reference to the aforementioned first to fifth embodiments in which the present invention is incorporated into semiconductor laser devices having a Fabry-Perot (FP) resonator. However, the present invention is also applicable to laser devices other than the FP resonator cavity semiconductor laser device. As such an example, a sixth embodiment is described below which incorporates the present invention to a distributed Bragg reflector (DBR) semiconductor laser device.

Figure 18:
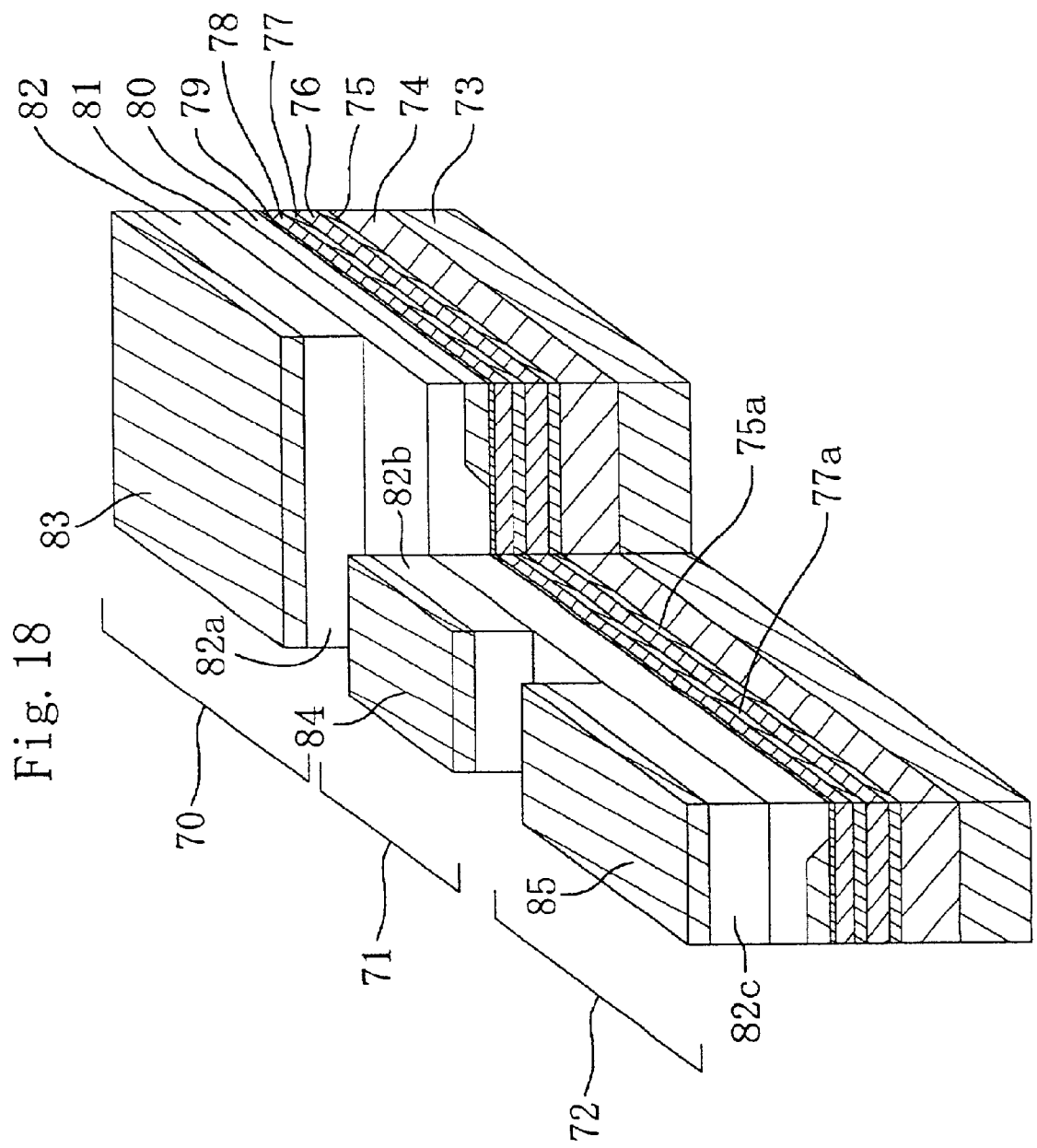
FIG. 18 is a schematic perspective cut-away view illustrating the structure of a semiconductor laser device according to a sixth embodiment of the present invention.

FIG. 18 is a schematic perspective cut-away view illustrating the structure of a semiconductor laser device according to the sixth embodiment of the present invention. As shown in the figure, the semiconductor laser device according to this embodiment comprises a gain region 70, a phase control region 71, and a DBR region 72 in the direction of length of the resonator cavity. That is, there is constructed a resonator cavity having, as reflectors, a cleaved facet (a front facet) forming an end face of the gain region 70 and an end face (a rear facet) of the DBR region 72. In the longitudinal direction of the resonator cavity, the gain region 70 is 500 μm in length, the phase control region 71 is 300 μm in length, and the DBR region 72 is 500 μm in length.

In addition, the semiconductor laser device according to this embodiment has the following layers which are sequentially formed in the gain region 70, the phase control region 71, and the DBR region 72 on an n-type GaAs substrate 73. The layers include an n-type cladding layer 74 of n-type $Al_{0.5}Ga_{0.5}As$, an active layer 75 configured to sandwich a single quantum well of GaAs between two optical guiding layers of $Al_{0.3}Ga_{0.7}As$, a first p-type cladding layer 76 of p-type $(Al_{0.7}Ga_{0.3})_{0.5}In_{0.5}P$, a second p-type cladding layer 77 of p-type $Al_{0.2}Ga_{0.8}As$, a third p-type cladding layer 78 of p-type $Al_{0.5}Ga_{0.5}As$, an etch stop layer 79 of p-type $Al_{0.2}Ga_{0.8}As$, a current blocking layer 80 of n-type $Al_{0.6}Ga_{0.4}As$ having a stripe-shaped window portion, a fourth p-type cladding layer 81 of p-type $Al_{0.5}Ga_{0.5}As$, and a p-type contact layer 82 of p-type GaAs.

In this structure, the portion of the active layer 75 which is located in the phase control region 71 and the DBR region 72 is disordered in the quantum well structure by the doping of an impurity or Zn, thereby being made generally transparent to a laser beam of the wavelength for generating laser. In addition, the portion of the second p-type cladding layer 77 which is located in the DBR region 72 is a diffraction grating 77a.

Furthermore, the portion of the p-type contact layer 82 which is located at each of the interfaces of the gain region 70, the phase control region 71, and the DBR region 72 has been removed by etching, whereby the p-type contact layer 82 is electrically separated into three portions 82a, 82b, and 82c. In addition to this, on each of the portions 82a, 82b, and 82c of the p-type contact layer 82 which are located in the gain region 70, the phase control region 71, and the DBR region 72, there are provided a gain control region electrode 83, a phase control region electrode 84, and a DBR region electrode 85, respectively. Although not illustrated, an n-type electrode is provided on the reverse side of the n-type GaAs substrate 73.

In other words, the semiconductor laser device is configured to make it possible to inject current separately into the gain region 70, the phase control region 71, and the DBR region 72. Therefore, by controlling separately the amount of current to be injected into the phase control region 71 and the DBR region 72, the wavelength for generating laser of the laser device can be varied continuously.

The DBR semiconductor laser device according to this embodiment makes it possible to control the wavelength for generating laser of the laser device by means of the period and the effective refractive index of the diffraction grating formed in the DBR region 72. However, since the DBR region 72 and the phase control region 71 are not gain regions, waveguide losses occur. This makes the density of injected carriers required for generating laser larger than in a semiconductor laser device with an ordinary FP resonator cavity. An increase in operating carrier density will cause overflow of more carriers from the active layer to the cladding layers, thereby causing the temperature characteristic to be degraded and high output operation to be performed with difficulty. In this context, as described with reference to the first to fifth embodiments, the p-type cladding layer for defining a barrier height is formed of AlGaInP, thereby decreasing the overflow of carriers to realize the high output operation.

-Evaluation of Semiconductor Laser Device-

The characteristics of the semiconductor laser device having the structure of this embodiment and a semiconductor laser device employed as a comparative example were evaluated. The comparative example is provided with a conventional first p-type cladding layer of p-type $Al_{0.5}Ga_{0.5}As$ instead of the first p-type cladding layer 76 of the semiconductor laser device according to this embodiment. In the evaluation, for ease of measurement, wavelengths have not been controlled. That is, current was injected only into the gain region 70 but no current was injected into the phase control region 71 and the DBR region 72.

Consequently, the semiconductor laser device according to this embodiment, which has the first p-type cladding layer 76 formed of $(Al_{0.7}Ga_{0.3})_{0.5}In_{0.5}P$, has realized a high output operation with a laser optical output of 200 mW at a wavelength for generating laser of 850 nm. The COD level was 220 mW. On the other hand, the semiconductor laser device, employed as the comparative example, having the first p-type cladding layer of $Al_{0.5}Ga_{0.5}As$, would not provide optical output until COD occurred and had optical output saturated at about 120 mW.

That is, as described in the first embodiment, it is conceivable that the first p-type cladding layer 76 or a cladding layer overlying the active layer 75 is formed of $(Al_{0.7}Ga_{0.3})_{0.5}In_{0.5}P$, thereby preventing the overflow of carriers from the conduction band edge to provide high optical output. Furthermore, it is also conceivable that the n-type cladding layer 74 or a cladding layer underlying the active layer 75 is formed of AlGaAs, while the first p-type cladding layer 76 or a cladding layer overlying the active layer 75 is formed of $(Al_{0.7}Ga_{0.3})_{0.5}In_{0.5}P$. Consequently, the semiconductor laser device according to this embodiment makes it possible to reduce heat which would be otherwise generated in the operating laser chip and thereby provide high output operation.

This embodiment has been explained with reference to a DBR semiconductor laser device to which the first embodiment is applied. However, the second to fifth embodiments applied to the DBR semiconductor laser device can also provide generally the same effect as that of each embodiment.

Other Embodiments

Each of the aforementioned embodiments has a p-type cladding layer overlying the active layer and an n-type cladding layer underlying the active layer; however, the p-type cladding layer may underlie the active layer and the n-type cladding layer may overlie the active layer.

What is claimed is:

1. A semiconductor laser device having an active layer, acting as a region for generating laser, provided on a substrate, said semiconductor laser device comprising:

an n-type cladding layer, formed of a first semiconductor containing two or more component elements but containing no phosphor, underlying said active layer; and a p-type cladding layer for defining a barrier height, said p-type cladding layer being formed of a second semiconductor containing four or more component elements and being disposed opposite to said n-type cladding layer to sandwich said active layer between said n-type cladding layer and said p-type cladding layer, wherein said second semiconductor includes more component elements than said first semiconductor, and a potential difference between conduction band edges of said p-type cladding layer for defining a barrier height and said active layer is greater than a potential difference between conduction band edges of said n-type cladding layer and said active layer.

2. The semiconductor laser device according to claim 1, wherein said active layer is formed of AlGaAs or GaAs, and said second semiconductor forming said p-type cladding layer for defining a barrier height has a composition expressed by $(Al_xGa_{1-x})_yIn_{1-y}P$ (0<x<1, 0<y<1).

3. The semiconductor laser device according to claim 2, wherein said p-type cladding layer for defining a barrier height has a thickness of 10 nm or more and 300 nm or less.

4. The semiconductor laser device according to claim 2, wherein
said second semiconductor has an Al composition ratio x within the range of 0.3<x<0.7.

5. The semiconductor laser device according to claim 2, wherein said second semiconductor has an In composition ratio y within the range of 0.45<y<0.55.

6. The semiconductor laser device according to claim 1, wherein said first semiconductor forming said n-type cladding layer has a composition expressed by $Al_{x1}Ga_{1-x1}As$. (0<x1<1).

7. The semiconductor laser device according to claim 6, wherein said first semiconductor has an Al composition ratio x1 within the range of 0.2<x1<0.7.

8. The semiconductor laser device according to claim 1, wherein said active layer has a thickness of 0.5 nm or more and 5 nm or less.

9. The semiconductor laser device according to claim 1, further comprising a semiconductor layer of $Al_{x2}Ga_{1-x2}As$ (0<x2<1) disposed opposite to said active layer to sandwich said p-type layer for defining a barrier height between said active layer and said semiconductor layer.

10. The semiconductor laser device according to claim 1, wherein said p-type cladding layer for defining barrier height overlies said active layer and includes phosphor as a component element, and said active layer is formed of a semiconductor containing no phosphor.

11. The semiconductor laser device according to claim 1, comprising a Fabry-Perot (FP) resonator cavity.

12. The semiconductor laser device according to claim 1, further comprising a distributed Bragg reflector (DBR) structure.

13. A semiconductor laser device having an active layer, acting as a region for generating laser, provided on a substrate, said semiconductor laser device comprising:
an n-type cladding layer formed of a first semiconductor containing no phosphor and underlying said active layer;
a p-type cladding layer for defining a barrier height, said p-type cladding layer being formed of a second semiconductor containing four or more component elements and being disposed opposite to said n-type cladding layer to sandwich said active layer between said n-type cladding layer and said p-type cladding layer; and
at least one p-type cladding layer for relaxing a first spike, said p-type cladding layer being provided between said p-type cladding layer for defining a barrier height and said active layer, wherein
the magnitude of a potential difference between valence band edges of said p-type cladding layer for defining a barrier height and said active layer is greater than the magnitude of a potential difference between valence band edges of said cladding layer for relaxing the first spike and said active layer.

14. The semiconductor laser device according to claim 13, wherein said active layer is formed of AlGaAs or GaAs, and said second semiconductor forming said p-type cladding layer for defining a barrier height has a composition expressed by $(Al_{x1}Ga_{1-x1})_{y1}In_{1-y1}P$ (0<x1<1, 0<y1<1).

15. The semiconductor laser device according to claim 14, wherein said p-type cladding layer for relaxing the first spike has a composition expressed by $Al_{x2}Ga_{1-x2}As$ (0<x2<1), where x2 increases in a direction from said active layer to the p-type cladding layer for defining a barrier height.

16. The semiconductor laser device according to claim 14, wherein said p-type cladding layer for relaxing the first spike has a composition expressed by $(Al_{x3}Ga_{1-x3})_{y2}In_{1-y2}P$ (0<x3<1, 0<y2<1), where x3 increases in a direction from said active layer to the p-type cladding layer for defining a barrier height.

17. The semiconductor laser device according to claim 14, further comprising a p-type contact layer disposed opposite to said active layer to sandwich said p-type cladding layer for defining a barrier height between said active layer and said p-type contact layer, and at least one p-type cladding layer for relaxing a second spike, said p-type cladding layer being provided between said p-type cladding layer for defining a barrier height and said p-type contact layer; wherein the magnitude of a potential difference between valence band edges of said p-type cladding layer for defining a barrier height and said p-type cladding layer for relaxing the second spike is less than the magnitude of a potential difference between valence band edges of said p-type cladding layer for defining a barrier height and said p-type contact layer.

18. The semiconductor laser device according to claim 17, wherein said p-type cladding layer for relaxing the second spike has a composition expressed by $Al_{x4}a_{1-x4}As$ (0<x4<1), where x4 decreases in a direction from said p-type cladding layer for defining a barrier height to said p-type contact layer.

19. The semiconductor laser device according to claim 17, wherein said p-type cladding layer for relaxing the second spike has a composition expressed by $(Al_{x5}Ga_{1-x5})_{y3}In_{1-y3}P$ (0<x5<1, 0<y3<1), where x5 decreases in a direction from said p-type cladding layer for defining a barrier height to said p-type contact layer.

20. The semiconductor laser device according to claim 14, further comprising a current blocking layer having a window portion, said current blocking layer being disposed opposite to said active layer to sandwich said p-type cladding layer for defining a barrier height between said active layer and said current blocking layer, and
a buried p-type cladding layer formed to fill in said window portion of said current blocking layer, wherein
a refractive index of said current blocking layer is less than refractive indices of said p-type cladding layer for defining a barrier height and said buried p-type cladding layer.

21. The semiconductor laser device according to claim 20, wherein said current blocking layer has a composition expressed by $Al_{x6}Ga_{1-x6}As$ (0<x6<1), and an etch stop layer of $(Al_{x7}Ga_{1-x7})_{y4}In_{1-y4}P$ (0<x7<1, 0<y4<1) is further provided between said p-type cladding layer for defining a barrier height and said buried cladding layer.

22. The semiconductor laser device according to claim 20, further comprising a p-type contact layer disposed opposite to said active layer to sandwich said p-type cladding layer for defining a barrier height between said active layer and said p-type contact layer, and
at least one p-type cladding layer for relaxing a second spike, said p-type cladding layer being provided between said buried p-type cladding layer and said p-type contact layer, wherein
the magnitude of a potential difference between valence band edges of said p-type cladding layer for relaxing the second spike and said p-type contact layer is less than the magnitude of a potential difference between valence band edges of said buried p-type cladding layer and said p-type contact layer.

23. The semiconductor laser device according to claim 22, wherein said p-type cladding layer for relaxing the second spike has a composition expressed by $Al_{x8}Ga_{1-x8}As$ (0<x8<1), where x8 decreases in the direction from said buried p-type cladding layer to said p-type contact layer.

24. The semiconductor laser device according to claim 14, comprising a Fabry-Perot (FP) resonator cavity.

25. The semiconductor laser device according to claim 14, comprising a distributed Bragg reflector (DBR) structure.

* * * * *